(12) United States Patent
Chen et al.

(10) Patent No.: US 9,362,935 B2
(45) Date of Patent: Jun. 7, 2016

(54) SYSTEM AND METHOD FOR ANALOG TO DIGITAL CONVERSION

(71) Applicant: University of South Australia, Adelaide, South Australia (AU)

(72) Inventors: Ying Chen, Adelaide (AU); Andre Pollok, Adelaide (AU); David Victor Lawrie Haley, Adelaide (AU); Linda Mary Davis, Adelaide (AU); Mark Damian McDonnell, Adelaide (AU)

(73) Assignee: University of South Australia, Adelaide (ZA)

( * ) Notice: Subject to any disclaimer, the term of this patent is extended or adjusted under 35 U.S.C. 154(b) by 0 days.

(21) Appl. No.: 14/421,534

(22) PCT Filed: Aug. 13, 2013

(86) PCT No.: PCT/AU2013/000888
§ 371 (c)(1),
(2) Date: Feb. 13, 2015

(87) PCT Pub. No.: WO2014/026223
PCT Pub. Date: Feb. 20, 2014

(65) Prior Publication Data
US 2015/0188556 A1    Jul. 2, 2015

(30) Foreign Application Priority Data

Aug. 13, 2012  (AU) ................................ 2012903466
Dec. 21, 2012  (AU) ................................ 2012905619

(51) Int. Cl.
*H03M 1/80* (2006.01)
*H03M 1/08* (2006.01)
(Continued)

(52) U.S. Cl.
CPC ............ *H03M 1/0854* (2013.01); *H03M 1/188* (2013.01); *H03M 1/361* (2013.01)

(58) Field of Classification Search
CPC ... H03M 1/1061; H03M 1/745; H03M 3/422; H03M 3/436; H03M 3/468; H03M 1/0854; H03M 1/188; H03M 1/361
USPC ........................................ 341/153, 155, 143
See application file for complete search history.

(56) References Cited

U.S. PATENT DOCUMENTS 8,682,904 B1 *  3/2014  Weber .......................... 707/748
2002/0163454 A1  11/2002  Yap et al.
(Continued)

FOREIGN PATENT DOCUMENTS

WO     2012/106395 A1     8/2012

OTHER PUBLICATIONS

International Preliminary Report on Patentability of PCT/AU2013/000888, dated Feb. 17, 2015, pp. 1-5.
(Continued)

*Primary Examiner* — Jean B Jeanglaude
(74) *Attorney, Agent, or Firm* — McDonnell Boehnen Hulbert & Berghoff LLP

(57) ABSTRACT

Parallel analog to digital converted (ADC) architectures that can be used to replace single path ADC architectures. The parallel ADC architecture can comprise N branches and one ADC per branch. These ADCs can be identical. However each branch can have a different path adjustments applied to the ADC. The path adjustments can be biases and/or gains and each ADC receives a different combination of biases and/or gain to generate multiple adjusted input signals. These are then combined to generate a quantized output signal. Using these parallel architectures a range of weighting and offset combining schemes can be employed to achieve improvements in signal to noise ratio and to reduce the impact of clipping as compared to a single path ADC architecture.

20 Claims, 10 Drawing Sheets

(51) Int. Cl.
*H03M 1/18* (2006.01)
*H03M 1/36* (2006.01)

(56) References Cited

U.S. PATENT DOCUMENTS

2010/0328125 A1* 12/2010 Pagnanelli .................. 341/143
2012/0147944 A1*  6/2012 Amirkhany et al. .......... 375/232
2013/0282369 A1* 10/2013 Visser et al. ................. 704/226

OTHER PUBLICATIONS

International Search Report with Written Opinion of PCT/AU2013/000888, dated Oct. 16, 2013, pp. 1-8.
Ben-Romdhane, Manel et al., "Nonuniformly Controlled Analog-to-Digital Converter for SDR Multistandard Radio Receiver," IEEE Transactions on Circuits and Systems II: Express Briefs (2011) vol. 58(12), pp. 862-866.
Black, William C. et al., "Time interleaved converter arrays," IEEE Journal of Solid-State Circuits (1980), vol. SC-15(6), pp. 1022-1029.
Cruz, Pedro Miguel et al., "Enhanced architecture to increase the dynamic range of sdr receivers," IEEE Radio and Wireless Symposium (RWS), (2011), pp. 331-334.
McDonnell, Mark D. et al., "Quantization in the presence of large amplitude threshold noise" Fluctuation and Noise Letters (2005), vol. 5(3), pp. L457-L468.
Gray, Robert M. et al., "Quantization" IEEE Transactions on Information Theory (1998), vol. 44(6), pp. 2325-2382.
Han, S. H. et al., "An overview of peak-to-average power ratio reduction techniques for multicarrier transmission," IEEE Wireless Communications (2005), vol. 12, pp. 56-65.

McDonnell, M. D. et al., "Stochastic pooling networks" Journal of Statistical Mechanics: Theory and Experiment (2009) P01012, pp. 1-18.
Kolble, E. "Approach to solve the AGC API issue in the tactical SDR domain—a waveform provider perspective", in SDR'11—WInnComm—Europe, (2011), pp. 48-53.
Lauritzen, Keir C. et al., "Impact of decorrelation techniques on sampling noise in radio-frequency applications," IEEE Trans. Instrumentation and Measurement (2010), vol. 59(9), pp. 2272-2279.
Max, Joel "Quantizing for minimum distortion" IRE Transactions on Information Theory IT(1960), pp. 7-12.
McDonnell, Mark D. "Applying stochastic signal quantization theory to the robust digitization of noisy analog signals" in Applications of Nonlinear Dynamics: Model and Design of Complex Systems, edited by V. In, P. Longhini, and A. Palacios (Springer, 2009), pp. 1-12.
Mitola III, J. "Software radios—survey, critical evaluation and future directions," IEEE (1992), pp. 13/15-13/23.
McDonnell, Mark D. et al., "Optimal information transmission in nonlinear arrays through suprathreshold stochastic resonance" Physics Letters A 352 (2006), pp. 183-189.
Seifert, E. "Enhancing the dynamic range of analog-to-digital converters by reducing excess noise," IEEE Pacific Rim Conf. on Communications, Computers and Signal Processing (1989), pp. 574-576.
Stocks, N. G. "Suprathreshold stochastic resonance in multilevel threshold systems" Physical Review Letters (2000), vol. 84(11), pp. 2310-2313.
Ulbricht, Gerald "Analog-to-digital conversion—the bottleneck for software defined radio," in Wireless Innovation Forum Conf. on Communications Technologies and Software Defined Radio (SDR'12—WinnComm—Europe), Brussels, Belgium, Jun. 2012.

* cited by examiner

SYSTEM AND METHOD FOR ANALOG TO DIGITAL CONVERSION

CROSS-REFERENCE TO RELATED APPLICATIONS

The present application is a U.S. National Phase Application pursuant to 35 U.S.C. §371 of International Application No. PCT/AU2013/000888 filed Aug. 13, 2013, which claims priority to Australian Provisional Patent Application No. 2012903466 filed Aug. 13, 2012 and Australian Provisional Patent Application No. 2012905619 filed Dec. 21, 2012. The entire disclosure contents of these applications are herewith incorporated by reference into the present application.

TECHNICAL FIELD

The present invention relates to systems that require a conversion from the analog into the digital domain. In a particular form, the present invention relates to analog to digital converter (ADC) architectures and methods.

BACKGROUND

Analog to Digital Converters (ADCs) are used to quantise or digitise an analog input signal. This digitized signal is used in the digital signal processing part of systems to reconstruct source data, or as an approximation of the source data. With the fast evolution of digital signal processing, analog to digital converters (ADCs) have become a key component in a wide range of applications, including audio/video processing, sensing, radar and communications. They are also a key enabling component in developing systems such as Software Defined Radio (SDR).

FIG. 1 shows a model of an ADC stage 10. An input signal y is sampled and quantised 14. During the analog to digital conversion process, clipping errors $e_c$ and quantisation errors q are introduced which limit the available signal to noise ratio (SNR) of the output signal. Additionally additive noise 12 is generated by the electronic components of the ADC or other noise source. In the following description, this noise is practically modelled as a fixed noise floor in the ADC and is not related to the input signal. However, the following mathematical analysis is valid for all additive noise which is not related to the input signal. A digitised output signal ŷ is then provided to another component, such as digital signal processor 20. As can be seen in FIG. 1, the ADC output signal quality and thus performance of the ADC is dependent upon clipping errors, quantisation errors and noise.

Let $\Delta$ be the quantisation step and let B denote the number of effective bits of the ADC, i.e. B does not include the sign bit and hence, the ADC has $2^{B+1}-2$ threshold levels symmetrically placed on either side of the zero level, in addition to the zero level (mid-tread). The most negative and positive input values that are not clipped by saturation (but may be rounded) by the ADC are given by ±A, where $$A = \left(2^B - 1 + \frac{1}{2}\right)\Delta.$$

That is the lower and upper limit of the unclipped input range are ±A. Assuming an ADC with only additive noise, an input signal y in the range $-A<y<A$ gives rise to $$\hat{y} = k\Delta, \tag{1}$$

$$k = \left\lfloor \frac{y}{\Delta} \right\rceil$$

at the output of the ADC, where $\lfloor \cdot \rceil$ rounds the argument to the nearest integer. Note that $k \in \{0, \pm 1, \ldots, \pm(2^B-1)\}$.

The signal distortion caused by the rounding operation in is referred to as quantisation error. Let q denote the quantisation error:

$$q(y) = y - \hat{y} = y - k\Delta. \tag{2}$$

Assuming that the input signal can be modelled as a random variable with probability density function (pdf) $f(y)$, the variance of the quantisation error, $\sigma_q^2$, can be computed as:

$$\sigma_q^2(y) = \sum_{k=-2^b+1}^{2^b+1} \int_{(k-\frac{1}{2})\Delta}^{(k+\frac{1}{2})\Delta} f(y) q^2(y) dy. \tag{3}$$

If the input distributions $f(y)$ satisfies certain conditions, the resulting quantisation error q is uniformly distributed on $[-\Delta/2, \Delta/2]$ such that the quantisation noise variance is $\sigma_q^2 = \Delta^2/12$. The conditions can be found for example in B. Widrow and I. Kollár, Quantization Noise: Roundoff Error in Digital Computation, Signal Processing, Control, and Communications. Cambridge University Press, 2008.

A second type of signal distortion arises from the fact that the input range ±A of an ADC where the device does not saturate is finite. An input signal exceeding this finite range, i.e. $|y|>A$, will overdrive the ADC into saturation. This type of distortion is referred to as clipping error and we define it as $$e_c(y) = \begin{cases} y - A, & y > +A \\ y + A, & y < -A \\ 0, & \text{otherwise} \end{cases}. \tag{4}$$

Assuming that the distribution of y is symmetric about zero, the variance of the clipping noise can be obtained as $$\sigma_c^2(y) = 2 \int_A^\infty f(y) e_c(y) dy \tag{5}$$

Assuming that the additive noise variance is $\sigma_n$, the SNR of the output signal is given by:

$$SNR = \frac{P(y)}{\sigma_c^2(y) + \sigma_q^2(y) + \sigma_n^2(y)} \tag{5a}$$

where P(y) denotes the average power of y. To simplify the analysis, at this point we ignore noise sources unrelated to the input signal such as sample clock jitter, imperfections in sample-and-hold circuitry (aperture jitter), thermal noise and any other distortions of the input signal due to the apparatus used to generate the input signal to be digitised (eg a sensor, receiver front end, etc). Ignoring these effects we can define the signal to quantisation and clipping noise ratio as:

$$SNR_{c,q} = \frac{P(y)}{\sigma_c^2(y) + \sigma_q^2(y)}, \quad (6)$$

It can thus be seen that the quantisation and clipping errors are related to the distribution and power of the input signal.

The increasingly important role of ADCs is driving attempts to improve the performance of ADCs to support both existing and emerging digital signal processing applications. For example there exists a gap between current ADC technology and the needs of SDR due to limiting factors such as finite sample rates and dynamic range, and the presence of noise.

One approach to improve the performance of an ADC is to combine the ADC stage with an automatic gain control (AGC) stage. The AGC stage is used to control the ADC input level with the goal of maximising ADC output signal quality (ie minimise the impact of quantisation and clipping errors). The AGC targets an ADC input operating point that reduces quantisation noise by maximizing input range without overdriving the ADC into saturation. FIG. 2 is a block diagram of a conventional system which combines an AGC stage with an ADC stage. The input signal x is fed to the AGC with gain g to generate an output signal y=gx. The gain may be an attenuation (g<1), unity (g=1) or amplification (g>1). This signal is then sampled and quantised by the ADC to yield a digital signal ŷ. However as is shown above in equations (3) and (5) the quantisation and clipping errors are related to the distribution and power of the input signal and thus it is not possible to simultaneously improve the resilience to quantisation error and clipping error by varying the AGC gain.

Several approaches have also been proposed that employ parallel ADCs to improve performance. One approach is a signal averaging architecture which reduces the effect of uncorrelated noise generated by the ADC components. However, by simply averaging the output signals generated by parallel ADCs with identical input signal, this approach does not improve resilience to quantisation and clipping noise. An alternate use of parallel ADCs has been proposed which reduces the effect of clipping noise in order to increase the overall range of input levels that are not clipped by saturation. The architecture includes two parallel ADCs, with an attenuator placed at the input to one of the devices. If the direct path ADC begins to clip, the circuit switches to the ADC with the attenuated input, hence performing selection combining. However, this method does not fully explore the potential for the digital signal processing to also reduce effective quantisation noise within the extended unclipped input range. Time interleaving of parallel ADCs has also been proposed as a means to increase the sample rate.

There is thus a need to develop improved ADC architectures and processing methods to improve performance of ADCs, or at least to provide a useful alternative to current systems.

SUMMARY

According to a first aspect of the present invention, there is provided a method for generating one or more quantised output signals from an analog input signal, the method comprising: splitting the analog input signal into a plurality of signal paths and applying a path adjustment to each signal path to generate a plurality of adjusted input signals, wherein the path adjustment comprises one or both of a path gain and a bias; quantising each of the plurality, of adjusted input signals to generate a plurality of quantised signals; and generating one or more quantised output signals based on the plurality of quantised signals.

In one form, the path adjustment applied to one of the plurality of signal paths is different from that applied to another one of the plurality of signal paths. In one form, the step of generating one or more quantised output signals comprises applying a weight and/or offset to each quantised signal and a function of weighted and/or offset quantised signals generates the quantised output signal. In one form, the function includes a linear combination of the weighted and/or offset quantised signals. In one form, the path adjustment, weights and/or offsets are chosen such that the signal to noise ratio of at least one of the one or more quantised output signals is improved compared to a quantised output signal of a single path architecture. In one form, a weight of zero is applied to a quantised signal if the magnitude of the respective adjusted input signal is greater than a magnitude threshold. In one form, the magnitude threshold for an adjusted input signal is different from that for another adjusted input signal. In one form, if the magnitude of each of the plurality of adjusted input signals is greater than the respective magnitude threshold, then the quantised output signal is the quantised signal from the adjusted input signal that is subject to the least amount of clipping.

In one form, a bias of zero is applied to a signal path if the signal to noise ratio of the respective adjusted input signal is smaller than an input signal to noise ratio threshold. In one form, the input signal to noise ratio threshold is determined based on the number of the plurality of signal paths, a joint distribution of the noise over the plurality of signal paths, and the number of bits and threshold levels of a quantiser which quantises the adjusted input signals in the plurality of signal paths. In one form, the input signal to noise ratio thresholds are obtained by performing a numerical optimisation to maximise the signal to noise ratio of the respective quantised output signal. In one form, the input signal to noise ratio threshold for an adjusted input signal is different from that for another adjusted input signal.

In one form, the weight and/or offset applied to each quantised signal is proportional to or at least dependent on the path gain and/or bias applied to the respective signal path.

In one form, the splitting step comprises splitting the analog input signal into N paths and each path has a path gain $g=[g_1\ g_2\ \ldots\ g_N]^T$ and/or bias $b=[b_1\ b_2\ \ldots\ b_N]^T$, and the output of each signal path is quantised to generate N quantised signals $\hat{y}=[\hat{y}_1\ \hat{y}_2\ \ldots\ \hat{y}_N]^T$, and one quantised output signal of the one or more quantised output signals is generated by applying N weights $w=[w_1\ w_2\ \ldots\ w_N]$ and/or offset $d=[d_1\ d_2\ \ldots\ d_N]^T$ to each of the N quantised signals to generate an output signal $\bar{x}=w^T(\hat{y}\ d)$. In one form, the weights are chosen according to $$w = \frac{g}{g^T g}.$$

In one form, the weights are chosen according to $$w = \frac{1}{1^T g}.$$

In one form, $w \propto Q^{-1}g$, where Q is a noise covariance matrix. In one form, $g_i=(1/m_i)g_1$ for $i=2\ldots N$ where each $m_i$ is an even integer. In one form, $g_i=1/2^{i-1}$ for $i=1\ \ldots\ N$. In one form, $g_i=(n_i/m_i)g_1$ for $i=2\ldots N$, where each pair $(n_i,m_i)$ with $n_i \leq m_i$ is a pair of positive co-prime integers. In one form, one of the pair of positive co-prime integers is even and another one is odd. In one form, the ratios $n_i/m_i$ are close to unity. In one form, $n_i=2^{k_i}-1$ and $m_i=2^{k_i}$ for $i=2\ldots N$, where the $k_i$ are positive integers.

In one form, each signal path comprises, one or more bias stages, and one or more gain stages, and the path gain of a signal path is the product of the one or more gain stages in the signal path. In one form, the analog input signal is split by a single signal splitter into a plurality of signal paths, and each path has a single bias stage and a single gain stage. In one form, the analog input signal is split by a plurality of signal splitters arranged in a cascading configuration. In one form, the offsets are chosen to compensate the path bias for that signal path from the quantised signal for that signal path to obtain an adjusted quantised signal for that signal path.

According to a second aspect of the present invention, there is provided an apparatus for generating one or more quantised output signals from an analog input signal, the apparatus comprising: a splitter for splitting the analog input signal into a plurality of signal paths and applying a path adjustment to each signal path to generate a plurality of adjusted input signals, wherein the path adjustment comprises one or both of a path gain and a bias; a quantiser for quantising each of the plurality of adjusted input signals to generate a plurality of quantised signals; and a processor for generating one or more quantised output signals based on the plurality of quantised signals.

In one form, the path adjustment applied to one of the plurality of signal paths is different from that applied to another one of the plurality of signal paths. In one form, the processor applies a weight and/or offset to each quantised signal and a function of weighted and/or offset quantised signals to generate the quantised output signal. In one form, the function includes a linear combination of the weighted and/or offset quantised signals. In one form, the path adjustment, weights and/or offsets are chosen such that the signal to noise ratio of at least one of the one or more quantised output signals is improved compared to a quantised output signal of a single path architecture. In one form, a weight of zero is applied to a quantised signal if the magnitude of the respective adjusted input signal is greater than a magnitude threshold. In one form, the magnitude threshold for an adjusted input signal is different from that for another adjusted input signal. In one form, if the magnitude of each of the plurality of adjusted input signals is greater than the respective magnitude threshold, then the quantised output signal is the quantised signal from the adjusted input signal that is subject to the least amount of clipping.

In one form, a bias of zero is applied to a signal path if the signal to noise ratio of the respective adjusted input signal is smaller than an input signal to noise ratio threshold. In one form, the input signal to noise ratio threshold is determined based on the number of the plurality of signal paths, a joint distribution of the noise over the plurality of signal paths, and the number of bits and threshold levels of a quantiser which quantises the adjusted input signals in the plurality of signal paths. In one form, the input signal to noise ratio thresholds are obtained by performing a numerical optimisation to maximise the signal to noise ratio of the respective quantised output signal. In one form, the input signal to noise ratio threshold for an adjusted input signal is different from that for another adjusted input signal. In one form, the weight and/or offset applied to each quantised signal is proportional to or at least dependent on the path gain and/or bias applied to the respective signal path.

In one form, the splitter splits the analog input signal into N paths and each path has a path gain $g=[g_1\ g_2\ g_N]^T$ and/or bias $b=[b_1\ b_2\ \ldots\ b_N]^T$, and the output of each signal path is quantised to generate N quantised signals $\hat{y}=[\hat{y}_1\ \hat{y}_2\ \ldots\ \hat{y}_N]^T$, and one quantised output signal of the one or more quantised output signals is generated by applying N weights $w=[w_1\ w_2\ \ldots\ w_N]^T$ and/or offset $d=[d_1\ d_2\ \ldots\ d_N]^T$ to each of the N quantised signals to generate an output signal $\bar{x}=w^T(\hat{y}+d)$.

In one form, the weights are chosen according to $$w = \frac{g}{g^T g}.$$

In one form, the weights are chosen according to $$w = \frac{1}{1^T g}.$$

In one form, $w \propto Q^{-1}g$, where Q is a noise covariance matrix. In one form, $g_i=(1/m_i)g_1$ for $i=2\ldots N$ where each $m_i$ is an even integer. In one form, $g_i=1/2^{i-1}$ for $i=1\ldots N$. In one form, $g_i=(n_i/m_i)g_1$ for $i=2\ldots N$, where each pair $(n_i,m_i)$ with $n_i \leq m_i$ is a pair of positive co-prime integers. In one form, one of the pair of positive co-prime integers is even and another one is odd. In one form, the ratios $n_i/m_i$ are close to unity. In one form, $n_i=2^{k_i}-1$ and $m_i=2^{k_i}$ for $i=2\ldots N$, where the $k_i$ are positive integers. In one form, each signal path comprises, one or more bias stages, and one or more gain stages, and the path gain of a signal path is the product of the one or more gain stages in the signal path. In one form, the analog input signal is split by a single signal splitter into a plurality of signal paths, and each path has a single bias stage and a single gain stage. In one form, the analog input signal is split by a plurality of signal splitters arranged in a cascading configuration. In one form, the offsets are chosen to compensate the path bias for that signal path from the quantised signal for that signal path to obtain an adjusted quantised signal for that signal path.

According to a third aspect of the present invention, there is provided a digital front end processing apparatus comprising the apparatus of the second aspect and/or its various forms.

According to a fourth aspect of the present invention, there is provided a receiver comprising the digital front end processing apparatus of the third aspect.

According to a fifth aspect of the present invention, there is provided a non-transitory processor readable medium, comprising instructions for causing a processor to implement the method of the first aspect and/or its various forms.

BRIEF DESCRIPTION OF DRAWINGS

A preferred embodiment of the present invention will be discussed with reference to the accompanying drawings wherein.

In the following description, like reference characters designate like or corresponding parts throughout the figures.

DESCRIPTION OF EMBODIMENTS

Figure 1:
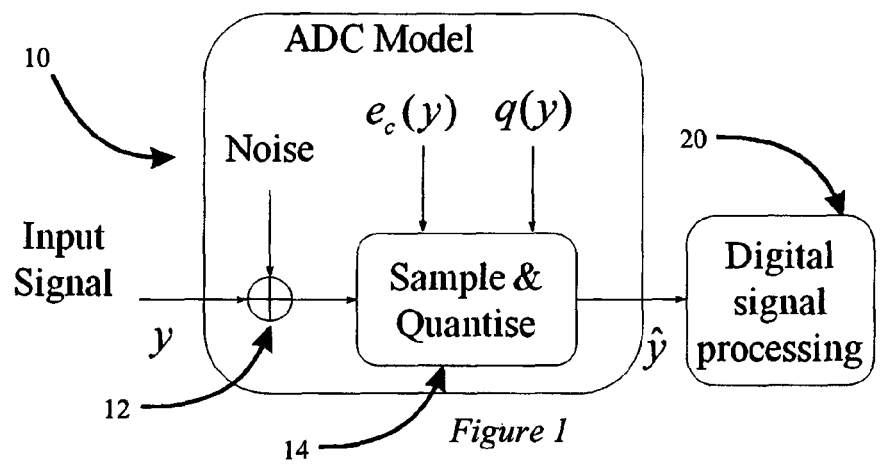
FIG. 1 is a schematic diagram of a model of an Analog to Digital Converter (ADC) stage.

Embodiments of ADC architectures and processing methods to improve the performance of ADCs will now be described. Several parallel (ie not unitary path) path architectures are described in which an analog input signal is split into a plurality of signal paths. In the context of applications that employ antennas, such as a communications system, the splitting of an analog input signal includes splitting of a signal from a single antenna, as well as splitting due to multiple spatially distributed antennas. A path adjustment comprising a path gain and a bias is applied to each signal path, and these adjusted input signals are quantised (eg by an ADC stage) to generate a quantised (or digital) signal. We use the term bias to refer to an analog signal (for example an analog signal of a particular value), which is added to an analog input signal. The path gains and biases can be independently set. The biases can be set to zero. The multiple quantised signals can then be combined to generate a quantised (or digitised) output signal. Alternatively a function of the multiple quantised signals (linear or nonlinear) generates a quantised output signal. The nature of the function can be determined based on the number of the plurality of signal paths, a joint distribution of the noise over the plurality of signal paths, and the number of bits and threshold levels of a quantiser which quantiles the adjusted input signals in the plurality of signal paths.

As was shown above in equations (3) and (5), the quantisation and clipping errors are related to the distribution and power of the input signal and thus it is not possible to simultaneously improve the resilience to quantisation error and clipping error by varying the AGC gain. Embodiments will be described which can be used to improve the performance of ADCs by improving either the quantisation error, clipping error or both (simultaneously). In what follows, we analyse the relationship between the AGC gain g and ADC performance, treating the ADC as an ideal quantiser. As shown above, the clipping error variance $\sigma_c^2$ and the quantisation error variance $\sigma_c^2$ are related to the probability density function of the input signal. We numerically tested the normalized mean square error (MSE) as a measure of the normalized variance between the ADC inputs and outputs and its components for a 10-bit ADC, for a uniformly distributed input coming from an 8-times oversampled BPSK modulated signal, and for a Gaussian distributed input coming from a multicarrier signal with 512 subcarriers respectively. We note that the combined normalized MSE is the inverse of the signal to quantisation and clipping noise ratio in equation (6).

The basic relationship between the AGC gain g and the normalized MSEs is similar for the different inputs. When g is small, the total error is dominated by the quantisation error. The clipping error is zero for the uniform distributed input and small for the Gaussian distributed input. As g increases, the impact of clipping error increases and eventually dominates the total error. From this analysis the value of g that provides the smallest total error is 14 dB for the uniform distributed signal and 6 dB for the Gaussian distributed signal. The difference in these values is due to the fact that a Gaussian distributed signal has a large peak to average power ratio whereas the uniformly distributed signal has a small peak to average power ratio. In either case it is not possible to simultaneously improve the resilience to quantisation error and clipping error by varying the AGC gain.

Several parallel (or multiple path) ADC architectures are described. These ADC architectures use parallel ADC paths (ie configured to have a plurality of signal paths or branches) each with independent path gains and biases, which are quantised and then combined after applying independent offsets and weights to each quantised signal to generate a one or more quantised output signals from an analog input signal. We use the term offset to refer to an additive signal (for example a constant signal), which is added to a quantiser output signal. Further, the combiner can apply a range of offset and weighting schemes to further improve the performance of the ADC such as by improving the signal to noise ratio of the quantised output signals. The path gains, biases, offsets and weights can be chosen such that the signal to noise ratio of the combined signal is increased compared to a single path (ie non parallel) architecture. In some embodiments (as discussed below) this architecture can improve the resilience to quantisation error or clipping errors. In some embodiments (as discussed below) this architecture simultaneously improves the resilience to quantisation error and clipping errors.

Figure 3:
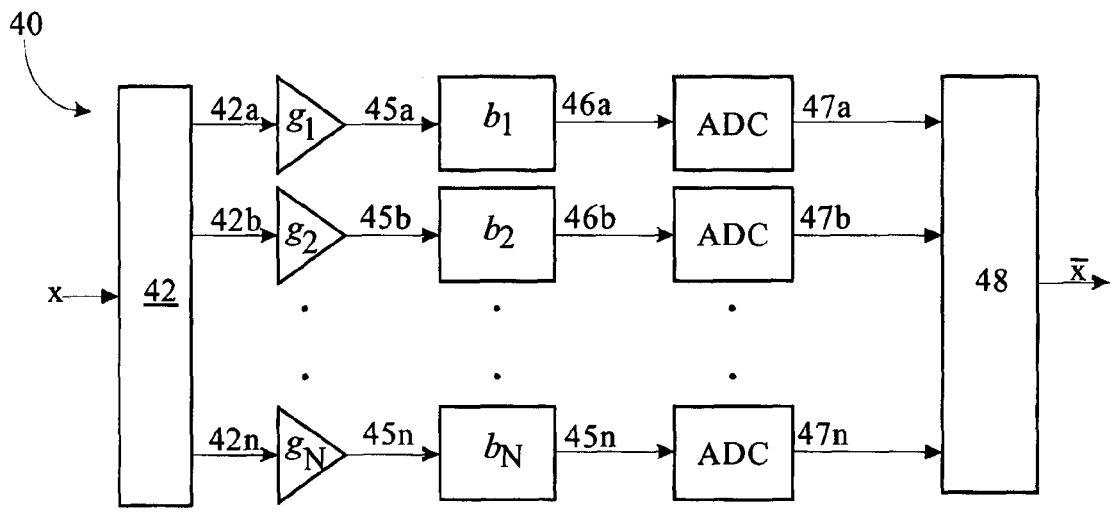
FIG. 3 is a block diagram of a parallel ADC architecture according to an embodiment.

FIG. 3 is a block diagram of a parallel ADC architecture 40 according to an embodiment. The ADC architecture (or ADC apparatus) receives an analog input signal x. The input signal x is then split into N parallel paths (or branches) by a single signal splitter 42 to generate a plurality of input signals 42a, 42b . . . 42$_N$. The signal splitter can be a conventional splitter device, or a similar device/apparatus that is able to generate multiple copies of the input signal. Alternatively, signals may be input via multiple paths, such as a multi-antenna array, obviating the need for the splitter. Some combination of multiple input paths and the use of one or more splitters is also possible. Each of the parallel paths comprises a gain stage $g_1$, $g_2$ . . . $g_N$ and bias stage $b_1$, $b_2$ . . . $b_N$ preceding a corresponding ADC stage. We assume that all N ADCs are driven by a common clock and are hence synchronised, although synchronisation arrangements could be used. Each of the input signals 42a, 42b . . . 42$_N$ is passed through an independent adjustment stage (comprising a gain stage and a bias stage) to generate a plurality of adjusted input signals 45a, 45b . . . 45$_N$, and gain and bias adjusted input signals 46a, 46b . . . 46$_N$. For each path, an adjusted input signal is provided as input to an ADC stage (that is each ADC stage is preceded by an adjustment stage). The gain and bias adjusted input signal for a path is given by:

$$y_i = g_i x + b_i, \quad i = 1, 2, \ldots, N \qquad (7)$$

Where $g_i$ is the gain in path i (which we will refer to as the path gain or branch gain) and $b_i$ is the bias in path i (which we will refer to as the path bias or branch bias). We will refer to the combination of $g_i$ and $b_i$ as path adjustment for path i. Without loss of generality we assume $g_1 \geq g_2 \geq \ldots \geq g_N$ (ie the first path has the largest gain, and the last path has the smallest gain). That is a path adjustment is applied to the input signal as it travels along the path, and the ADC stage quantises this adjusted input signal to generate a quantised signal. Each of the adjustment stages are independently adjustable (that is they can each be configured to apply a different gain and bias from each other adjustment stage) to the analog input signal. Note that two paths, or branches can apply the same gain and bias if desired. Note that we also define an ADC path to include the path (or branch) and the ADC stage. That is a path can comprise a signal splitter, an adjustment stage and an ADC stage and each ADC path is used to generate a quantised signal. A combiner 48 is used to combine the plurality of quantised signals 47a, 47b . . . 47$_N$ to generate one or more quantised output signals.

We assume that excluding the sign bit, the ADC in path i has $B_i$ bits such that the quantisation step size is $\Delta_i = 2^{-B_i}$. The resulting unclipped input range is $\pm A_i$, where $$A_i = \left(2^{B_i} - 1 + \frac{1}{2}\right)\Delta_i.$$

To simplify the following discussion, we assume $B_i = B$ for i=1 . . . N such that $\Delta_i = \Delta = 2^{-B}$ and $$A_i = A = \left(2^{B_i} - 1 + \frac{1}{2}\right)\Delta_i$$

for i=1 . . . N. However in other embodiments the different ADC's could be configured with different numbers of bits. Furthermore, the aforementioned assumptions imply, uniform quantisation. In other embodiments, ADCs with non-uniform quantisation may be used. For example, assuming a non-uniform quantiser in path i, the following treatment is still valid if the corresponding path gain g is chosen to be a non-linear function of the analog input signal x (i.e. $g_i(x)$ instead of a constant gain $g_i$), which is such that the non-uniform quantiser responds to the non-linearly adjusted signal in the same way as a uniform quantiser would respond to the linearly adjusted signal (i.e. the gain stage applies a constant gain $g_i$ that does not depend on x). Let us return to the case with identical B-bit ADCs with uniform quantisation in all paths. For the ith path the quantisation error introduced by the ith ADC is $q_i$ (from (2)):

$$q_i(y_i) = \hat{y}_i - y_i = k_i \Delta - y_i \qquad (8)$$

and the ADC output of ith path (from (1)) can then be re-expressed as $$\hat{y}_i = y_i + q_i(y_i). \qquad (9)$$

Typically, the quantisation error $q_i$ is modelled as a random variable with uniform distribution on $[\Delta/2, \Delta/2]$. In this case, the quantisation noise variance is $\sigma_q^2(y) = \Delta^2/12$. This widely used assumption is valid for a range of input signals $y_i$ and the conditions on the pdf $f(y_i)$ can be found for example in B. Widrow and I. Kollár, Quantization Noise: Roundoff Error in Digital Computation, Signal Processing, Control, and Communications. Cambridge University Press, 2008. At this point, we simply assume that $f(y_i)$ satisfies the conditions, but do not specify the distribution further. Furthermore, let us introduce the vector notation $$y = [y_1 \, y_2 \ldots y_N]^T,$$

$$\hat{y} = [\hat{y}_1 \, \hat{y}_2 \ldots \hat{y}_N]^T,$$

$$g = [g_1 \, g_2 \ldots g_N]^T,$$

$$q = [q_1 \, q_2 \ldots q_N]^T,$$

$$b = [b_1 \, b_2 \ldots b_N]^T, \qquad (10)$$

such that we can write (7) and (9) more compactly as $$y = gx + b,$$

$$\hat{y} = y + q = gx + b + q. \qquad (11)$$

Consider any two paths of the parallel ADC architecture in FIG. 3, say, paths i and j and assume for simplicity that $b_i = b_j = 0$. The relative gain between the paths is $\eta = g_j/g_i$, which is smaller than or equal to 1 as a result of the assumption that $g_j \leq g_i$ for j>i. Suppose $$\eta = \frac{n}{m},$$

where n and m are positive co-prime integers such that n≤m. Under the assumption that the quantisation noise in each path is uniformly distributed within $[-\Delta/2, \Delta/2]$ with variance $\sigma_q^2 = \Delta^2/12$, it can be shown that the correlation of the quantisation noise components $q_i$ and $q_j$ is $$\rho_q = \frac{E\{q_i q_j\}}{\sigma_q^2} = \begin{cases} \frac{1}{mn}, & m \text{ and } n \text{ odd} \\ -\frac{1}{2mn}, & m \text{ odd and } n \text{ even,} \\ & \text{or } m \text{ even and } n \text{ odd} \end{cases} \quad (12)$$

We highlight here that the quantisation noise correlation can take on positive or negative values, depending on how the integers n and m are chosen. Furthermore, it can be seen that $\rho_q \to 0$ when the product mn grows large. It will be discussed later that negative correlation values are beneficial for ADC diversity combining.

A (digital) combiner 48 receives the N quantised signals $\hat{y}$ from each ADC branch or path and combines these into a quantised output signal $\bar{x}$. The combiner may simply add or sum the input signals together, or if the paths and/or ADCs are not synchronised, the combiner may perform any necessary synchronisation (Eg phase and/or time offsets) to enable combining of the input signals. Without loss of generality, the combiner can apply an offset and a weight to each of the quantised signals:

$$\bar{x} = w^T(\hat{y} + d) \quad (13)$$
$$= w^T \hat{y} + w^T d,$$
$$w = [w_1 \ w_2 \ \dots \ w_N]^T,$$
$$d = [d_1 \ d_2 \ \dots \ d_N]^T$$

where $w_i$ are real-valued weights and $d_i$ real-valued offsets. Using (11), we can rewrite (13) as $$\bar{x} = w^T(gx + b + q + d) \quad (14)$$
$$= w^T gx + w^T b + w^T q + w^T d$$

If the biases and offsets are selected such that they have equal magnitude, but opposite signs (i.e. d=−b), they cancel out in (14) and the resulting signal-to-noise ratio (SNR) at the output of the ADC diversity combiner is then $$SNR(w, g) = P_x \frac{w^T g g^T w}{w^T Q w}, \quad (15)$$

where $$P_x E\{x^2\}$$

is the average power of the input signal and $Q = E\{qq^T\}$ is the quantisation noise covariance matrix. Note that this model can easily be generalised to include additional noise components such as thermal noise. In this case, Q in (15) needs to be replaced by the overall noise covariance matrix that takes all noise components into account. If the biases and offsets do not cancel each other, Q in (15) needs to be replaced by $Q+bb^T+dd^T$.

Figure 4:
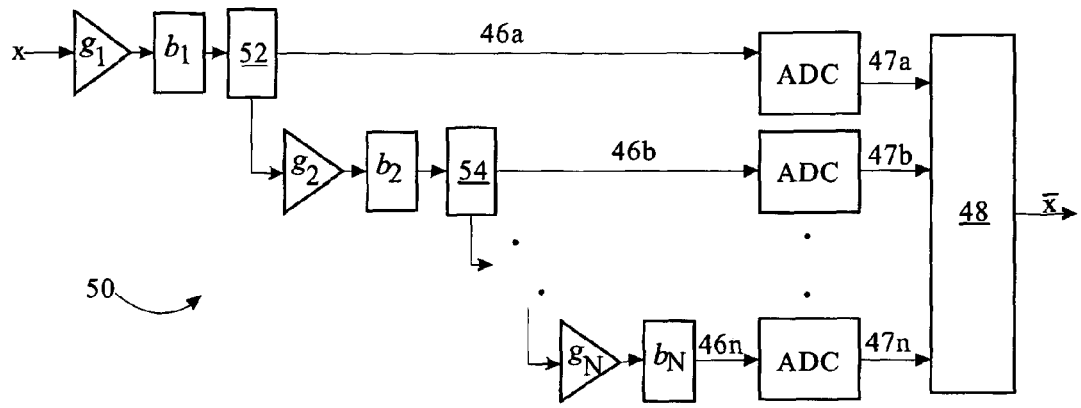
FIG. 4 is a block diagram of a cascading parallel ADC architecture according to an embodiment.

We further note that the arrangement shown in FIG. 3 could be further modified as illustrated in FIG. 4, which is block diagram of a cascaded parallel ADC apparatus 50 according to an embodiment. In this embodiment signal splitters 52, 54 are located after each adjustment stage, for example, $g_1$ and $b_1$, $g_2$ and $b_2$ etc which comprises a gain stage and a bias stage. Thus the analog input signal is split by a plurality of signal splitters arranged in a cascading configuration. Each path provided to an ADC stage comprises one or more signal splitters and one or more adjustment stages. As described later in more detail, the path gain of a signal path is the product of the one or more gain stages in the signal path and the path bias of a signal path is the weighted sum of the one or more bias stages in the signal path. This is in contrast to the embodiment shown in FIG. 3, in which a single signal splitter is used to split the analog input signal into N identical paths each of which comprises a single adjustment stage and provides an adjusted input signal to an ADC at the end (or on) the path. Thus once again we can define an ADC path as a path with an ADC at the end. Like the arrangement shown in FIG. 3, the adjustment stages are configured so that at least one of the path adjustments is different from at least one of the other path adjustments. That is not all the adjustment stages are identical, or putting it another way, there is at least one pair of signal paths having different path gains and/or biases. The ADC path is defined as comprising one or more signal splitters, one or more adjustment stages and an ADC. As shown in FIG. 4, the input signal is sent through a first gain adjustment stage $g_1$ and bias adjustment stage $b_l$ and then into a signal splitter 52 which sends the adjusted signal 46*a* to the first ADC, and splits off another copy of the adjusted signal 46*a* which is provided as input to a second (or further) gain adjustment stage $g_2$ and bias adjustment stage $b_2$. The output of this second adjustment stage is sent through a signal splitter 54 and a second adjusted input signal 46*b* is provided to the input of a second ADC. The signal splitter 54 also splits a second copy of the input signal off along another path segment. Further adjustment stages and splitters could be used, before a signal is provided as input for the last adjustment stage to generate a last (Nth) adjusted input signal 46*n*, which is then provided as input to the last (Nth) ADC stage. In this case a path is defined as comprising the chain of one or more signal splitters and one or more gain and bias adjustment stages.

The output of each path is an adjusted input signal 47*a* 47*b* 47*n* which is provided as input to an ADC (we note that the ADC can also be considered as part of the path or branch). The total gain of a path is comprised of the product of the preceding gain stages in the chain and the total bias of a path is a weighted sum of the preceding bias stages. Thus in FIG. 4 the top path has gain $\eta_1$ and a bias $b_1$ and generates a first adjusted signal $y_1 = \eta_1 x + b_1 = g_1 x + b_1$ 45*a* on the first path prior to the top ADC (ie the ADC associated with the first path). The signal splitter feeds this signal to a lower path with a further adjustment stage having a gain $\eta_2$ and a bias $b_2$ to generate a second adjusted signal $y_2 = \eta_2 (\eta_1 x + b_1) + b_2 = \eta_1 \eta_2 x + \eta_2 b_1 + b_2$ 45*b* which is then provided to the second ADC. That is the combined gain of the second path is $g_2$ which is the product of the gains in the path (and this is equivalent to the gain in the second path shown in FIG. 3) and the total bias in the second path is $\eta_2 b_1 + b_2$. The total gains and biases of the remaining paths can be obtained analogously. The N quantised signals 47*a* 47*b* 47$_N$ are then provided to the combiner. In one embodiment N is 2, in which case, and without loss of generality, we can define $\eta_1 = 1$ and $\eta_2 = \eta = g$.

Other embodiments can also be used to split the analog input signal into a plurality of signal paths and applying a path gain and bias to each signal path to generate a plurality of adjusted input signals. Each signal path can comprise one or more signal splitters, and one or more adjustment stages. Alternatively, individual gain and bias stages may be used instead of adjustment stages comprising both a gain and a bias stage. Note that conceptually, a gain stage is equivalent to an adjustment stage with zero bias and a bias stage is equivalent to an adjustment stage with unit gain. In these embodiments the path gain of a signal path can be the product of the one or more gain stages in the signal path and the path bias of a signal path can be a weighted sum of the one or more bias stages in the signal path and at least one of the path gains and/or biases is different from at least one of the other path gains and/or biases. A combined adjustment stage and splitter stage can be provided. For example the device could make a copy of the input signal and apply a gain and bias to the copy. The output of the combined adjustment stage and splitter stage would be the input signal and an adjusted signal (this could be generalised to multiple output signals). Alternatively the adjustment could be applied to all input signals. Thus the output of the splitter is two (or more) adjusted signals with the same adjustment, or possibly different adjustments. For example the architecture shown in FIG. 4 could be modified by adding further gain and/or bias stages between the signal splitter and an ADC (ie a combination of the architectures shown in FIGS. 3 and 4). In FIG. 4, each of the signal splitters splits an input signal into two signals. However signal splitters like that shown in FIG. 3 could be used which split a signal into more than 2 signals. Other variations are possible. From a conceptual view, the analog input signal is split into a plurality of signal paths, wherein along each path the analog input signal passes through one or more signal splitters and one or more adjustment stages, and the output of each path is a an adjusted input signal with a total path gain and a total path bias, which is provided to an ADC stage. The multiple paths are then combined in a combiner 48. We use to term parallel to distinguish the architectures from single path architectures, and it does not require the paths to be physically parallel. The parallel architectures could be alternatively be referred to as branching or cascading architectures, or even as a tree. That is the input signal is the root of the tree and signal splitters are nodes used to generate branches. The leaves are, the plurality of quantised signals which are provided to the combiner. Path adjustment stages can be placed in the branches and so each path through the tree has a path gain and bias.

The ADC apparatus generates a quantised approximation of the continuous input signal x which is preferably as accurate as possible. Each of the ADC paths performs an independent quantisation, and thus the output of each path is a different observation of the same input signal and hence provides some level of diversity. As will be shown below the use of parallel ADC paths (ADC diversity combining) can be used to increase the output SNR of the quantised output signal. In our case; increasing the SNR corresponds to reducing the levels of quantisation and clipping noise relative to the signal power in the output. In other words, we would like to leverage the diversity provided by multiple paths such that the combined signal, denoted as $\bar{x}$, more accurately approximates x than any of the individual path estimates. Here we have assumed that the biases $b_i$ are zero: With this assumption, the following discussion and mathematical expressions are simpler and more instructive. Similarly, we assume zero offsets $d_i$ in the combiner. However, most of the concepts and expressions are also valid in the case where the biases and offsets have equal magnitude, but opposite signs, i.e. d=−b. The more general case with arbitrary non-zero $b_i$ and $d_i$ will be discussed later.

As will be shown below a variety of weighting methods or schemes can be utilised to achieve a simultaneous improvement of the ratios of signal to quantisation error and clipping error. Several of the schemes that we will discuss rely on the fact that the input signals of the two ADCs are scaled versions of each other. As outlined above we assume that the first path has the largest gain and the last ($N^{th}$) path has the smallest gain. For example, with reference to FIG. 4, $\eta_2$<1 such that $y_2$ is an attenuated version of $y_1$ (and so on). Consequently, the ADC operating on the attenuated signal will introduce larger quantisation errors relative to the signal power $P(y_2)$, but is less likely to clip the input signal. Initially we assume an operation point such that none of the ADCs introduce clipping. However, later we will also consider the case with clipping.

One approach for providing an increased unclipped input range is selection diversity which is attractive due to its simplicity. In this case the combiner selects the quantised signals from the paths that suffers the least from ADC distortions. Always selecting the best path guarantees a performance at least as good as that of a single ADC and can provide an increased unclipped input range. As soon as the input signal starts to overdrive the first ADC, the architecture switches to the output of the second ADC. If the second ADC is overdriven the architecture switches to the output of a third ADC, and so on. Thus the ADC chosen is the path with the largest path gain $g_i$ such that $g_i x \le A$ to ensure the ADC operates on the least attenuated input signal that is not corrupted by clipping errors. This can be understood as setting a weight of 1 for the selected path, and zeros for all other paths. Whilst such diversity combining can extend the unclipped input range, it does not exploit the full potential of digital signal processing in the sense that it only selects one of the signals rather than combining them. In particular, the selected signal has same SNR as that of the selected ADC.

Another approach is signal averaging, in which each of the path gains is identical (ie $g_1=g_2=g$). The effect of uncorrelated noise generated by the ADC components (e.g. thermal noise) is reduced by forming the unweighted average of the output signals. However since identical ADCs are used, the quantisation noise is highly correlated across paths and cannot be combated with signal averaging.

Another approach is referred to as gain weighted combining (GWC), in which the weight applied to each quantised signal is proportional to the path gain $g_i$ that the respective quantised signal was generated from. That is:

$$w_{gwc} \propto g. \tag{16}$$

This approach takes advantage of the fact that all N ADC output signals contain useful information about the input signal. Unlike signal averaging GWC can be used to reduce the effective quantisation noise. Substituting $w_{gwc}$ into (15), we find the resulting SNR after combining $$SNR_{gwc}(g) = P_x \frac{(g^T g)^2}{g^T Q g}. \tag{17}$$

Note that the scaling of $w_{gwc}$ does not affect the SNR. In practice, however, it makes sense to normalise $w_{gwc}$ such that $w_{gwc}^T g = 1$, which is the case for $$w_{gwc} = \frac{g}{g^T g}. \tag{18}$$

With this normalisation, (14) yields $$\bar{x}_{gwc} = w_{gwc}^T g x + w_{gwc}^T q = x + \frac{g^T q}{g^T g}, \tag{19}$$

i.e. the combiner output $\bar{x}_{gwc}$ equals the true input value x plus the effective quantisation noise $g^T q/g^T g$. Table 1 provides a pseudo-code listing of Gain Weighted Combining (GWC).

TABLE 1

Algorithm 1: Gain Weighted Combining (GWC).

| | Input: $\hat{y}$, g | |
| | Output: $\bar{x}_{gwc}$ | |
| 1 | $w_{gwc} \leftarrow g$ | |
| 2 | $w_{gwc} \leftarrow w_{gwc}/w_{gwc}^T g$ | Normalisation |
| 3 | $\bar{x}_{gwc} \leftarrow w_{gwc}^T \hat{y}$ | |

In the case of N=2, GWC reconstructs the input signal x as $$\bar{x}_{gwc} = \frac{g_1 \hat{y}_1 + g_2 \hat{y}_2}{g_1^2 + g_2^2}. \quad (20)$$

In the case that $\eta=1$ GWC is equivalent to signal averaging and thus $g_1=g_2=g$. In the absence of random additive noise, both ADCs operate on identical input signals such that $\hat{y}_1=\hat{y}_2$ and in this case, (20) simplifies to $\bar{x}_{sa}=\hat{y}_1/g$ i.e. signal averaging does not provide any advantage over a single ADC as the quantisation noise in both paths is fully correlated. If we assume that in addition to the fully correlated quantisation noise, the ADCs generate independent random additive noise, we have $\hat{y}_1 \neq \hat{y}_2$ and (20) yields $$\bar{x}_{sa} = \frac{\hat{y}_1 + \hat{y}_2}{2g}. \quad (21)$$

Signal averaging can reduce the effect of random additive noise in $\bar{x}_{sa}$ by as much as 3 dB. The performance of GWC combining can be improved by selecting the gains based upon maximising the SNR of the signal generated by the combining step.

The SNR gain achieved by GWC is $$\gamma_{gwc} = \frac{SNR_{gwc}}{SNR} = \frac{(1+\eta^2)^2}{1+\eta^2+2\eta\rho_q} \quad (22)$$

where SNR denotes the signal to noise ratio of the quantised signal at the output of a single ADC.

As mentioned earlier, $\rho_q$ should be negative in order to maximise $\gamma_{gwc}$. Recall from (12) that for $\eta=n/m$, the quantisation noise correlation is $$\rho_q = -\frac{1}{2mn}$$

if one of the positive co-prime integers m and n is even and the other one odd. In this case, we have an SNR gain $$\gamma_{gwc} = \frac{(1+\eta^2)^2}{1+\eta^2-\frac{1}{m^2}}, \quad (23)$$

which asymptotically approaches $1+\eta^2$ when m grows large. Since $n \leq m$, we should choose n such that $n=n/m \to 1$ as m grows large in order to approach the maximum SNR gain of $\gamma_{gwc} \to 2$, i.e. 3 dB. In other words, both integers n and m should be chosen large, while ensuring that their ratio $\eta=n/m$ is close to unity and one of them is even and the other one odd. In one embodiment, this is achieved by choosing $n=2^k-1$ and $m=2^k$, where k is a positive integer. By increasing k, the ratio n/m can be selected arbitrarily close to unity. More generally for the case N>2, we can select $g_i=(n_i/m_i)g_1$ for i=2 ... N, where each pair $(n_i,m_i)$ with $n_i \leq m_i$ is a pair of positive co-prime integers, one of which is even and one of which is odd. In one embodiment we choose $n_i=2^{k_i}-1$ and $m_i=2^{k_i}$ for i=2 ... N, where the $k_i$ are positive integers. In one embodiment, ratio n/m can be selected arbitrarily between ½ and 1.

Let us return to the case N=2 and let $\eta=1/m$, where m is a positive integer. Noting that this corresponds to $\eta=n/m$ with n=1, it can be seen from (12) that the quantisation noise correlation is $$\rho_q = \begin{cases} \frac{1}{m}, & m \text{ odd} \\ -\frac{1}{2m}, & m \text{ even} \end{cases} \quad (24)$$

in this case. Substituting (24) into (22) yields $$\gamma_{gwc} = \begin{cases} \frac{(1+m^{-2})^2}{1+3m^{-2}} \leq 1, & m \text{ odd} \\ (1+m^{-2})^2 > 1, & m \text{ even} \end{cases} \quad (25)$$

That is, GWC provides an SNR gain $\gamma>1$ over a single ADC when m is even. On the other hand, m=1 offers no gain ($\gamma=1$) and all odd m>1 give rise to an SNR degradation $\gamma<1$. In the more general case with N>2 there is one correlation coefficient for each pair of branches, i.e. (N choose 2) coefficients in total. More generally for the case N>2 we can thus select the gains $g_i=(1/m_i)g_1$ for i=2 ... N where each $m_i$ is an even integer. Preferably each $m_i$ is a power of two and in one embodiment we choose $g_i=1/2^{i-1}$ for i=1 ... N (ie for N=3 we have gains of [1, ½, ¼]). Note that $\gamma$ is independent of the quantisation step $\Delta$.

As shown above, the weights can be found by maximising the SNR of the signal generated by the combining step. In the case that N=2, this is equivalent to minimising the correlation of the quantised signals across the two quantised signals (assuming g=(1/m)). When N>2, maximising the SNR of the signal generated by the combining step can be performed by minimising the correlation of the quantised signals across the plurality of quantised signals provided that each of the paths gains are different (ie no paths or branches have the same gain).

Figure 5A:
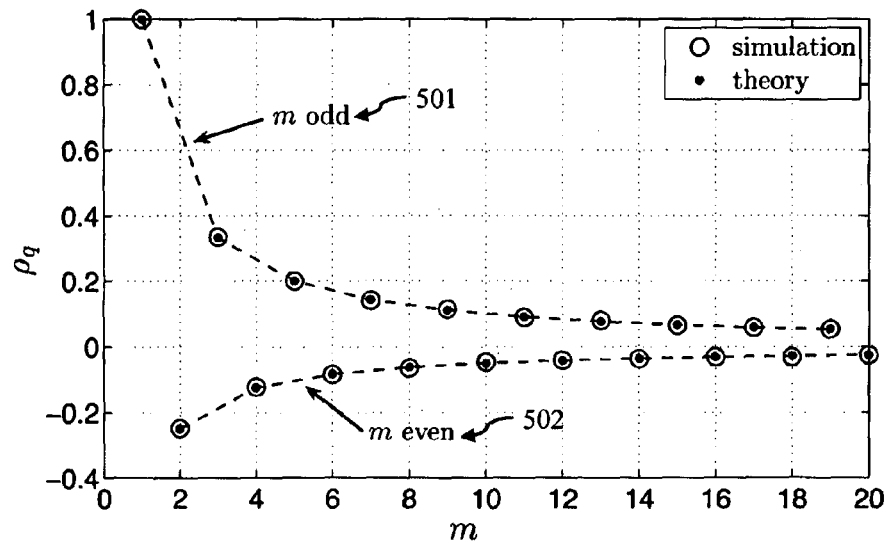
FIG. 5A is a plot of the correlation co-efficient vs attenuation according to an embodiment.

FIG. 5A shows the quantisation noise correlation $\rho_q$ as a function of the attenuation m according to an embodiment with N=2 paths. Analytical results from (24) and Monte-Carlo simulation results for a uniform input signal x are indicated by dots and circular markers, respectively, and are in good agreement. While we observe full correlation for m=1 as both ADCs operate on identical signals, the correlation diminishes asymptotically towards large m. FIG. 5A clearly illustrates the oscillation between positive and negative correlation predicted by (24). To highlight this behaviour, we have separately connected the theoretical values for even and odd m with dashed lines.

Figure 5B:
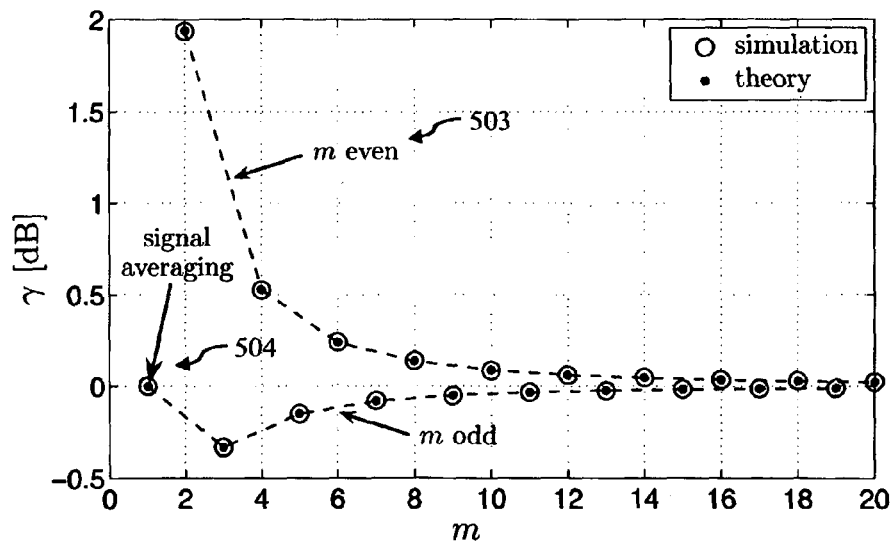
FIG. 5B is a plot of the relative Signal to Noise Ratio (SNR) gain vs attenuation according to an embodiment, in which the SNR is the signal to noise ratio of the output signal.

FIG. 5B is a plot of the relative Signal to Noise Ratio (SNR) gain γ (in dB) as a function of the attenuation m according to an embodiment with N=2 paths. FIG. 5B shows the corresponding theoretical and simulated values of γ in dB. As predicted by (25), an SNR loss is incurred relative to a single ADC when m is odd and we observe the largest degradations at m=3. When m=1, GWC is equivalent to signal averaging. Whilst this technique has been reported to average out uncorrelated noise, it is unable to reduce the effect of (fully-correlated) quantisation noise and signal averaging therefore offers no gain over a single ADC (γ=1).

For even m, GWC benefits from the negative quantisation noise correlation and provides a gain γ>1 as shown in FIG. 5B. The maximum gain of close to 2 dB is achieved when m=2 (η=½) in a dual ADC architecture which corresponds to the most negative correlation (see FIG. 5B). Asymptotically, γ approaches zero dB as m grows large due to the signal in the second path becoming too weak to provide any significant combining gain. While we have neglected thermal noise generated by the ADC components, it should be pointed out that additive uncorrelated noise can easily be incorporated into our analysis. With increasing variance of the random additive noise $\sigma_n^2$, γ reduces. For example, the maximum value γ=1.94 dB (m=2, see (25)) drops to 1.43 dB when $\sigma_n^2=\sigma_q^2$ and for $\sigma_n^2 \to \infty$, asymptotically approaches 0.97 dB.

Another approach is referred to as equal gain combining (EGC), in which equal or identical weights are applied to each quantised signal (the ADC path output signals) before summing over them. Again using the normalisation $w_{egc}^T g=1$, the EGC weight vector is given by $$w_{egc} = \frac{1}{1^T g}, \quad (26)$$

where 1 denotes an all-one vector of the same size as g. Substituting $w_{egc}$ into (14) and (15), we find the combined signal and the resulting SNR as $$\bar{x}_{egc} = w_{egc}^T g x + w_{egc}^T q = x + \frac{1^T q}{1^T g}, \quad (27)$$

$$SNR_{egc}(g) = P_x \frac{(1^T g)^2}{1^T Q 1}. \quad (28)$$

Table 2 provides a pseudo-code listing of Equal Gain Combining (EGC).

TABLE 2

Algorithm 2: Equal Gain Combining (EGC).

|   | Input: ŷ, g |   |
|---|---|---|
|   | Output: $\bar{x}_{egc}$ |   |
| 1 | $w_{egc} \leftarrow 1$ |   |
| 2 | $w_{egc} \leftarrow w_{egc}/w_{egc}^T g$ | Normalisation |
| 3 | $\bar{x}_{egc} \leftarrow w_{egc}^T \hat{y}$ |   |

Another approach is referred to as Maximal Ratio Combining (MRC), in which a set of optimal weights that optimizes the Signal to Noise Ratio (SNR) of the quantised output signal $\bar{x}$ is used for combining. Typically this comprises obtaining the set of weights $\{w_i\}$ such that the SNR of the reconstructed signal $\bar{x}$ is maximised.

Weights may be designed against other criteria, e.g. such that optimality is to be interpreted broadly such that the designed set of weights results in an output SNR, which approach the maximal SNR, but which may be selected based upon other optimisation criteria (eg complexity reduction or reducing the number of operations).

We observe that the w that maximises (15) is the dominant eigenvector associated with the generalised eigenproblem:

$$P_x g g^T w = \lambda' Q w, \quad (29)$$

where λ' is the generalised eigenvalue. Under the assumption that the quantisation noise covariance matrix Q is non-singular, we can left-multiply (29) by $Q^{-1/2}$ to obtain $$P_x Q^{-1/2} g g^T Q^{-1/2} Q^{-1/2} w = \lambda' Q^{1/2} w. \quad (30)$$

Letting $v=Q^{1/2}w$ and $\lambda=\lambda'/P_x$, (30) can be rewritten as the standard eigenproblem $$(Q^{-1/2} g g^T Q^{-1/2}) v = \lambda v. \quad (31)$$

Noting that the matrix on the left-hand side has rank one, the eigenvector associated with the non-zero eigenvalue satisfies $$v \propto Q^{-1/2} g \quad (32)$$

or equivalently, after substituting $v=Q^{1/2}w$, $$w_{mrc} \propto Q^{-1} g. \quad (33)$$

Substituting (33) into (15) yields $$SNR_{mrc}(g) = P_x g^T Q^{-1} g \quad (34)$$

Note that the MRC solution only requires proportionality as the SNR is not affected by a real-valued scaling factor in $w_{mrc}$. As in the GWC case, we choose the arbitrary scaling factor such that $w_{mrc}^T g=1$. Evidently this is the case for $$w_{mrc} = \frac{Q^{-1} g}{g^T Q^{-1} g}. \quad (35)$$

From (14), we find the resulting signal at the output of the combiner $$\bar{x}_{mrc} = w_{mrc}^T g x + w_{mrc}^T q \quad (36)$$

$$= x + \frac{g^T Q^{-1} q}{g^T Q^{-1} g},$$

where the second term is the effective quantisation noise after combining.

Table 3 provides a pseudo-code listing of Maximal Ratio Combining (MRC).

TABLE 3

Algorithm 3: Maximal Ratio Combining (MRC).

|   | Input: ŷ, g |   |
|---|---|---|
|   | Output: $\bar{x}_{mrc}$ |   |
| 1 | $w_{mrc} \leftarrow Q^{-1} g$ |   |
| 2 | $w_{mrc} \leftarrow w_{mrc}/w_{mrc}^T g$ | Normalisation |
| 3 | $\bar{x}_{mrc} \leftarrow w_{mrc}^T \hat{y}$ |   |

So far we have considered the case without clipping. However, when the amplitude of the input signal to any of the ADCs exceeds +/−A, the device saturates and the quantised output signal is clipped. Clipping errors are potentially very large and can be far more severe than quantisation noise. The various diversity combining schemes such as GWC, EGC and MRC discussed above do not provide an adequate countermeasure. If clipping occurs in one or more of the ADC paths, the combined signal will also be corrupted by clipping errors. To address this issue, a method referred to as Hybrid Combining (HC) will now be discussed whose smart logic avoids the aforementioned issue.

Let denote $w_{hyb}$ the combining vector for our hybrid combining (HC) scheme and let $w_{hyb,i}$ be its i-th component. Our HC scheme assigns weights $$w_{hyb,i} \propto \begin{cases} w_i, & |y_i| \leq A \\ 0, & |y_i| > A \end{cases}, \quad (37)$$

where $w_i$ is a weight for the i-th ADC path computed by any arbitrary combiner. For example, $w_i$ could have been generated by GWC or MRC. Note from (37) that the weights are proportional to those of the arbitrary combiner, but zero for those paths for which clipping has been detected. This approach ensures that the combiner output is not corrupted by potentially large clipping errors, whilst still exploiting the diversity of all paths that operate within their unclipped range. We used proportionality rather than equality in (37) as setting some of the components to zero requires a re-normalisation to ensure $w_{hyb}^T g = 1$. More generally we can replace the range A in equation (37) with a threshold. That is a weight of zero is applied to a quantised signal if the magnitude of the adjusted input signal is greater than a magnitude threshold value. This threshold may be a clipping based threshold, or determined based upon the range A, or another appropriate value such as an indication of a noise spike or other contamination of the signal. Note that (37) assumes that the ADCs in all paths saturate at the same input signal level ±A. Assuming instead that non-identical ADCs are used and that the ADC in path i starts to clip when the input signal is outside of the range $\pm A_i$, the magnitude threshold A in (37) should be replaced by $A_i$.

Recall that we assumed $g_1 \geq g_2 \geq \ldots \geq g_N$. As a result, clipping is most likely to occur in the first path and least likely in path N (ie the path with the smallest gain). If the input signal x is such that all ADCs are driven into saturation, only the output of path N should be routed to the combiner output as the clipping error is smallest in this path. Note that in the more general case with non-identical ADCs that saturate at different input signal levels, clipping is not necessarily least likely to occur in branch N. If all ADCs are driven into saturation, the ADC output signal of the path that is subject to the smallest clipping error should be routed to the combiner output.

Table 4 provides a pseudo-code listing of Hybrid Combining (HC).

TABLE 4

Algorithm 4: Hybrid Combining (HC).

| | Input: $\hat{y}$, g, w, N, A | w is arbitrary combiner |
|---|---|---|
| | Output: $\bar{x}_{hyb}$ | |
| 1 | for i ← 1 to N do | |
| 2 |   if $|\hat{y}_i| \leq A$ then | |
| 3 |     $w_{hyb,i} \leftarrow w_i$ | |
| 4 |   else | Clipping detected |
| 5 |     $w_{hyb,i} \leftarrow 0$ | |
| 6 | if $w_{hyb} = 0$ then $w_{hyb,N} \leftarrow 1$ | All paths clipped |
| 7 | $w_{hyb} \leftarrow w_{hyb}/w_{hyb}^T g$ | Normalisation |
| 8 | $\bar{x}_{hyb} \leftarrow w_{hyb}^T \hat{y}$ | |

Figure 2:
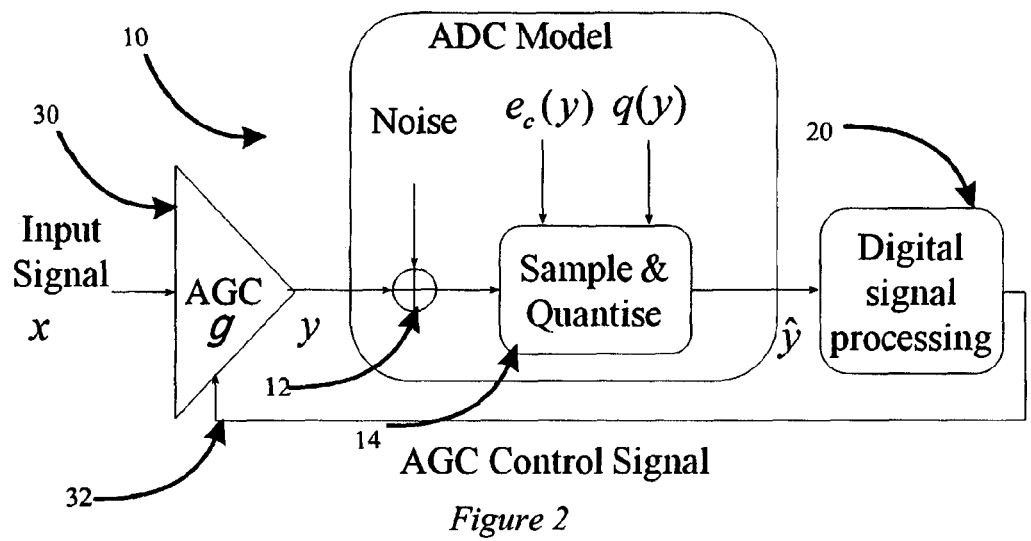
FIG. 2 is a schematic diagram of a model of conventional Automatic Gain Control (AGC) stage and Analog to Digital Converter (ADC) stage.

Simulations were performed to evaluate the performance of a dual path parallel ADC architecture implementing the various combining methods described above. A 10-bit ADC modelled according to FIG. 2 was used, with thermal noise power level −70 dB relative to the full scale of the ADC. The thermal noise components of the two paths are assumed to be uncorrelated white noise. Treating the ADC and AGC as a system, the performance is measured in SNR which is calculated as the ratio between the input signal power P(x) and the mean square value of $e = x - \bar{x}$. We consider two different distributions of the input signal x, namely a uniform and a Gaussian distribution. The uniformly distributed signal is generated using an 8-times oversampled BPSK single carrier waveform. The Gaussian distributed signal is generated using a 512-subcarrier OFDM waveform, with BPSK modulated subcarriers. The AGC input signal x is chosen to have power P(x) = −20 dB. The attenuation in the second path is set to be $\eta = \frac{1}{2}$, which can be easily implemented by a passive 6 dB attenuator. The approaches compared include a selection diversity scheme (SEL), an equal gain signal averaging scheme (Averaging), a gain weighted combining technique (GWC), and the hybrid combiner (HYB).

Figure 6A:
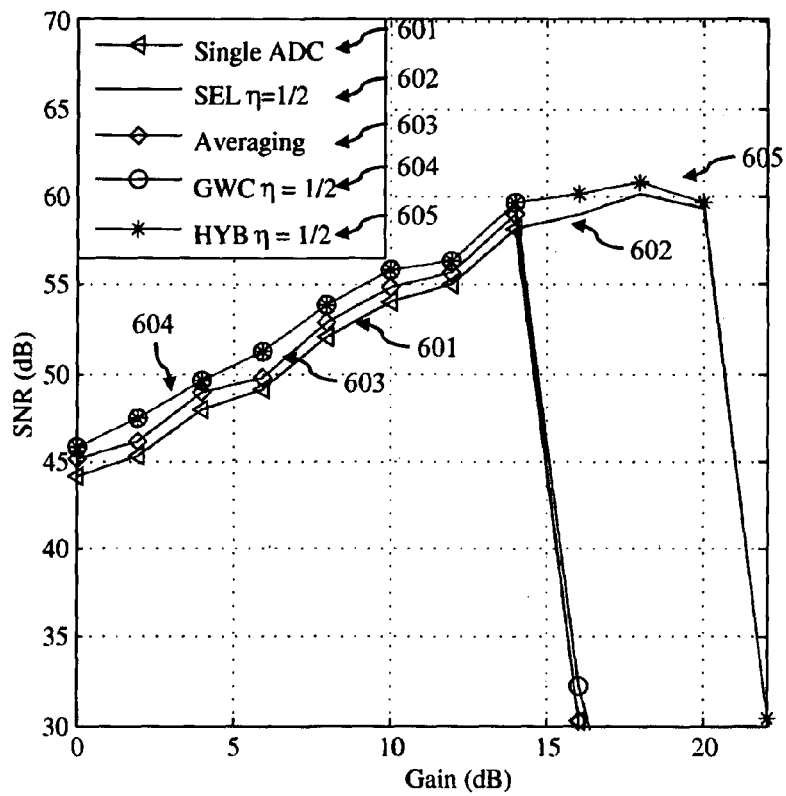
FIG. 6A is a plot of the performance of embodiments of a parallel ADC architecture, for a 10-bit ADC, uniformly distributed input, BPSK modulation, with thermal noise 70 dB below full scale of the ADC.

FIG. 6A is a plot of the performance of embodiments of a parallel ADC architecture, for a 10-bit ADC, uniformly distributed input, BPSK modulation, with thermal noise 70 dB below full scale of the ADC. FIG. 6A shows the SNR of the output signal after combining versus the first path gain $g_1$ for the uniformly distributed input signal. The SNR behaviour changes when $g_1 = 14$ dB. According to FIG. 2A this is the point where the dominating contributor to the error shifts from quantisation to clipping. The curve with triangle markers represents the performance of a single 10 bit ADC. The selection combiner, represented as the curve without markers, can improve the SNR in the clipping error dominated region. However it provides the worst performance in the quantisation dominated range. This is because when $g_1$ is small, the selection combiner will only use path 1. Hence, as shown in FIG. 6A, the selection combiner performance in this region matches that of a conventional single ADC system. The signal averaging method, represented as the curve with diamond markers, provides approximately 1 dB SNR improvement over the selection combiner in the quantisation dominated region. This is achieved by reducing the impact of the thermal noise. However, the SNR of the averaging method degrades rapidly to less than 30 dB when clipping errors start to dominate as the gain is increased. The gain weighted combiner, marked with circle, achieves approximately 2 dB performance improvement in the quantisation dominated region. This is made possible by its ability to reduce the effective quantisation noise in the combined output. Similar to the averaging method, when the clipping error starts to dominate, the SNR achieved by GWC reduces rapidly. In contrast to all of the above methods, the hybrid combiner provides performance improvement in both the quantisation error dominated region and clipping error dominated region. When $g_1 < 14$ dB, like GWC, the hybrid combiner achieves approximately 2 dB SNR improvement. When $g_1 > 14$ dB, the hybrid combiner achieves a significant SNR improvement, over 25 dB for $g_1 = 16$ dB, and also outperforms the selection method. Improvement over the selection combining method is achieved through reduction in the effective quantisation error. When the gain is increased to over 20 dB, the SNR of both the selection combiner and the hybrid combiner undergo a similar drop in SNR. It can also be observed from FIG. 6A, that to achieve over 55 dB SNR, the unclipped range of the ADC input is extended by 6 dB from [10 dB, 14 dB] to [10 dB, 20 dB] for both the selection combiner and the hybrid combiner.

The hybrid combiner provides almost 60 dB SNR when $g_1 \in$ [14 dB, 18 dB], whereas the selection combiner provides 1 to 2 dB less SNR in the same region.

Figure 6B:
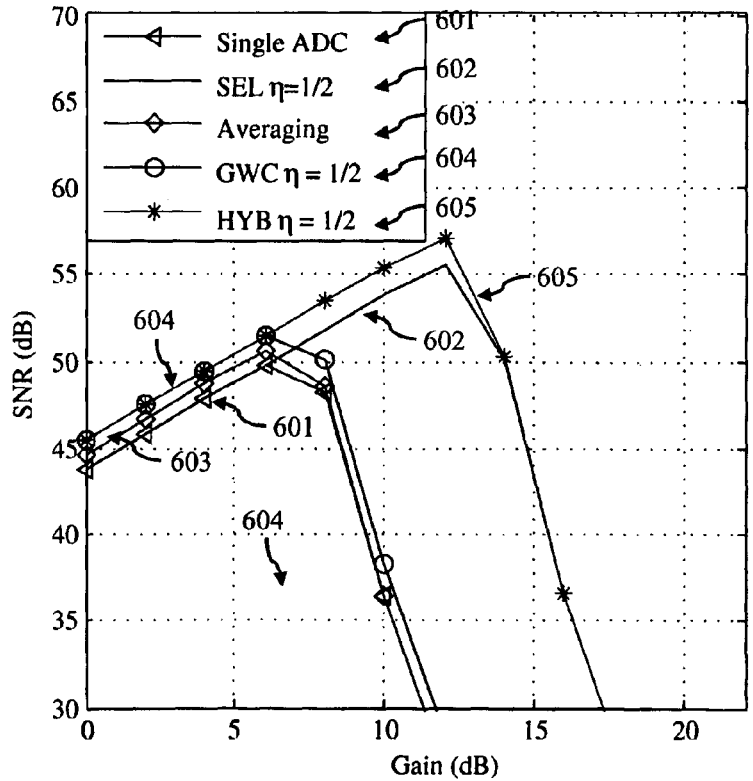
FIG. 6B is plot of the performance of embodiments of a parallel ADC architecture, for a 10-bit ADC, Gaussian distributed input, BPSK modulation, with thermal noise 70 dB below full scale of ADC.

FIG. 6B is plot of the performance of embodiments of a parallel ADC architecture, for a 10-bit ADC, Gaussian distributed input, BPSK modulation, with thermal noise 70 dB below full scale of ADC. FIG. 6B shows the SNR of the output signal after combining versus the first path gain $g_1$ for the Gaussian distributed input signal. The SNR behaviour changes when $g_1$=6 dB. According to FIG. 6B this is the point where the dominating contributor to the error shifts from quantisation to clipping. The performance of the different approaches show similar trends to those observed in FIG. 6A. In the quantisation dominated region, the averaging method achieves 1 dB SNR improvement against the selection combiner and conventional single ADC by reducing the effective thermal noise, whereas the GWC and hybrid combiner achieve approximately 2 dB by reducing the effective quantisation error. In the region dominated by clipping errors, the conventional single ADC, GWC and averaging method suffer significant SNR degradation. However, in this region the selection combiner and the hybrid combiner maintain the increasing SNR versus gain trend until $g_1$=12 dB. When the gain is increased beyond 12 dB, both the selection combiner and hybrid combiner exhibit a similar drop in SNR. It can also be observed from FIG. 6B that the ADC input range that provides over 50 dB SNR has been extend by 6 dB for the hybrid and selection combiners compared to GWC. Overall, the proposed hybrid combiner achieves approximately 2 dB SNR improvement over the selection combiner and 1 dB SNR improvement over the averaging method when $g_1 \leq 6$ dB. It also achieves a significant SNR improvement over the GWC and averaging methods, in addition to approximately 2 dB SNR improvement over the selection combiner when 6 dB<$g_1$<14 dB. The hybrid combiner provides a maximum SNR of 57 dB, which is 5 dB higher than that of the GWC and signal averaging, and 2 dB higher than that of the selection combiner.

We now consider another embodiment in which the path adjustments are a set of biases rather than gains applied to the input signals before the ADC stage. We will then later consider the combined use of both bias and gain adjustments using the schemes described above. We consider a parallel architecture in which multiple quantizers (ADC stages) operate on the same input signal, and thus provide multiple measurements of the same input sample. It is assumed that the designer has freedom to modify the mean value of the input (e.g. by adjusting it with a bias) and the freedom to process the outputs, before combining the multiple measurements for each input sample. Previously, theoretical studies, for example as discussed in M. D. McDonnell, N. G. Stocks, C. E. M. Pearce, and D. Abbott, Fluctuation and Noise Letters 5, L457 (2005), M. D. McDonnell, N. G. Stocks, C. E. M. Pearce, and D. Abbott, *Stochastic Resonance: From Suprathreshold Stochastic Resonance to Stochastic Signal Quantisation* (Cambridge University Press, Cambridge, UK, 2008), and M. D. McDonnell, in *Applications of Nonlinear Dynamics: Model and Design of Complex Systems*, edited by V. In, P. Longhini, and A. Palacios (Springer, 2009), pp. 249-262, have shown that independent additive noise on the inputs to each quantizer can provide enhanced performance when the response of more than one such quantizer is combined by summation. This holds both for binary quantizers and multi-bit quantizers. However such approaches require modification or optimisation of the threshold levels of individual quantizers. Instead we take a different approach and do not attempt to modify or optimise the threshold levels of individual quantizers. The model we study thus captures the features of real communication/sensor systems that could be operated using parallel ADCs. Consequently, we focus our attention on applying a path adjustment to each signal path that the ADCs operate on, and combining the responses of the ADCs in a controlled manner.

Specifically, we show that a useful way of combining the ADC responses (we will also refer to these as quantizers) includes the following steps. First, bias the input to each quantizer by distinct levels, such that some or all biases may be positive or negative. Second, linearly or nonlinearly combining the responses of each quantizer into a single (scalar or vector) measurement. This combining can be achieved in several ways. It can be seen that a specific bias applied to a signal path is another form of path adjustment similar to the gain and/or bias adjustments described above.

We begin with a mathematical problem description and consider quantiser notation. We assume a setup consisting of N identical parallel $\log_2(M+1)$ bit scalar quantizers. Therefore each quantizer operates using M threshold levels, and has a response comprised from M+1 discrete output states. We label the set of states as $\{0, 1, \ldots, M\}$. We write the quantization operation performed by each quantizer as $Q(\cdot)$. We assume that similar to a flash ADC, the quantizer threshold levels are uniformly spaced on a fixed finite interval. Specifically, here we assume an interval of [0,1] and assume the threshold levels are $$\theta_i = \frac{i}{M+1}, \quad (38)$$
$$i = M, \ldots, M.$$

Consequently, we have $$Q(y) = i, \; y \in [\theta_i, \theta_{i+1}), \; i = 0, 1, \ldots, M, \quad (39)$$

where $\theta_0 := -\infty$ and $\theta_{M+1} := \infty$. We do not assume the input to the quantizer is confined to the interval [0,1]; for example, additive noise will ensure y can take values outside this interval.

We introduce the random variable $\hat{Y}_j$ to describe the response of the j-th quantizer to input $y_j$ (we think of $\hat{Y}_j$ as a random variable, because we assume the input is a sample from a random variable). We label the states of $\hat{Y}_j$ such that $\hat{y}_j \in \{0, 1, \ldots, M\}$, Thus we have $$\hat{y}_i := Q(y_i), \hat{y}_j \in \{0,1,\ldots,M\}, j=1,\ldots,N. \quad (40)$$

Note that in general we have $y_j$ as the sum of a value common to all j, and noise and/or biases that are potentially different for all j. We denote the common value as x and the noise values as $z_j$. We now describe biases.

We introduce a set of N distinct bias terms that are either added or subtracted from the input to each quantizer. We label these as $b_j$, $j=1, \ldots, N$, where each $b_j$ may be positive or negative. Addition of any $b_j<0$ is equivalent to subtracting $-b_j$ if $b_j<0$. We introduce $y_j := x+z_j+b_j$ to represent the sum of specific outcomes from the signal, bias and noise random variables that are operated on by the j-th quantizer. Thus we have $\hat{y}_j := Q(y_j)$ as the response of the j-th quantizer to particular total input $y_j$.

Now we introduce notation to describe the quantized output signal of the system that results when it is assumed that the combined response of all N quantizers is mathematically equivalent to first summing them, prior to application of weights and offsets. First, we introduce the random variable $V = \sum_{j=1}^{N} \hat{Y}_j$, and label its outcomes as v, where $v \in 0, 1, \ldots,$ NM−1, NM). Note that in the absence of random additive noise, if all biases are identical (e.g. $b_j = b \forall j$), then each quantizer's response to x will be identical, and consequently v will be restricted to the subset (0, M, 2M, ..., ..., NM). On the other hand, the presence of noise or the presence of non-identical biases enables all NM+1 possible states of V to occur, thus enabling an increase from a $\log_2(M+1)$ bit to a $\log_2(NM+1)$ bit representation. This suggests that ensuring all quantizer inputs are adjusted by distinct biases will ensure a performance gain following combining.

We now consider the design of biases and combining, and we first consider biases to create a virtual quantizer. Here we assume a linearly spaced set of unique biases, $b_j(j=1, \ldots N)$. The biases may be positive or negative. Specifically, we choose biases as $$b_j = \frac{j - 0.5(1+N)}{N(M+1)}, \quad (41)$$
$$j = 1, \ldots, N.$$

Note that if N=1, then $b_1 = 0$. The maximum and minimum values of the biases are $$\frac{\pm 0.5(N-1)}{N(M+1)},$$

and thus half the $b_j$ are positive and half are negative.

These levels were chosen such that the resulting multi-quantizer system consists of a set of NM distinct threshold levels in total, which are linearly spaced between the smallest and largest 'virtual threshold level.' We write the distance between thresholds plus biases in this 'virtual quantizer' as $$\Delta_v := b_{j+1} - b_j = \frac{1}{N(M+1)}. \quad (42)$$

We introduce the set $\phi_k$, $k=1, \ldots$ NM to describe the threshold levels in the virtual quantizer; these can be expressed as $$\phi_k = \frac{k + 0.5(N-1)}{N(M+1)} \quad (43)$$
$$k = 1, 2, \ldots, NM.$$

Note that the largest virtual quantizer threshold value is $$\max_k \{\phi_k\} = \phi_{NM} = \frac{MN + 0.5(N-1)}{N(M+1)} \leq 1 - \Delta_v, \quad (44)$$

and the smallest value is $$\min_k \{\phi_k\} = \phi_1 = \frac{0.5(N+1)}{N(M+1)} \geq \Delta_v. \quad (45)$$

For an ideal uniform quantizer, we would have $\min_k \{\phi_k\} = \Delta_v$ and $\max_k \{\phi_k\} = 1 - \Delta_v$. Therefore, for N>1, there is a range of the input variable that is not ideally uniformly quantised using NM virtual thresholds. Below we show how this may be avoided, if desired, or compensated for in the decoding part of the combining stage, to some extent.

We now consider attenuation and biases for a perfectly linearly spaced virtual quantizer. Here we show that it is possible to guarantee ideal uniformly spaced virtual threshold levels. This is achieved by attenuating the input signal around its DC value as well as using biases. The aim is to produce a resulting dynamic range of the input that is exactly matched to linearly spaced virtual thresholds that result from biases. We assume the input is a random variable, X with support $X \in [0, 1]$. Our aim is achieved by ensuring the input to each ADC is $$Y = \frac{(NM+1)X + 0.5(N-1)}{N(M+1)}. \quad (46)$$

Notice that when X=0 and X=1, the resulting values of Y are exactly $\Delta_v$ smaller and larger than the minimum and maximum virtual thresholds written above, i.e. this gap is equal to the distance between virtual thresholds, as desired.

Notice also that converting X to Y can be achieved by first attenuating it by a gain factor of $$\alpha = \frac{NM+1}{N(M+1)}. \quad (47)$$

Next, we achieve our goal by using a different set of biases from $\{b_j\}$, namely we would use a new set of biases $$\overline{b}_j = b_j - \frac{0.5(N-1)}{N(M+1)} \quad (48)$$
$$= \frac{j-N}{N(M+1)}, \quad j = 1, \ldots, N. \quad (49)$$

Note that if N=1, we have $\overline{b}_1 = 0$, and now we have all $\overline{b}_j \leq 0$.

The threshold levels in the resulting virtual quantizer remain spaced by $\Delta_v$, and can be expressed as $$\overline{\phi}_k = \frac{k}{N(M+1)} \quad (50)$$
$$k = 1, \ldots, NM.$$

Note that the largest virtual quantizer threshold value is $$\max_k \{\overline{\phi}_k\} = \overline{\phi}_{NM} = \frac{M}{M+1} = \alpha - \Delta_v, \quad (51)$$

and the smallest value is $$\min_k \{\overline{\phi}_k\} = \overline{\phi}_1 = \frac{1}{N(M+1)} = \Delta_v, \quad (52)$$

and thus we have shown that we have an ideal uniform quantizer, since the maximum input value of Y is $\alpha$.

The presence of independent noise in each quantizer, creates, to some extent, a virtual NM level quantizer. This virtual quantizer is not, however, ideal given the noise conditions, except when the noise is so large that it dominates quantization noise. It is possible to show numerically that provided the noise is sufficiently large, that combining N quantizer responses by summation provides superior theoretical performance when biases are not used, compared to when they are used. This suggests a system design that enables an adaptive choice of whether or not to use biases. Specifically, if quantizer responses are combined by summation, then: If the input noise is small, then employ the biases as described above (Mode 1); if the input noise is large, then do not employ biases at all (Mode 2). The signal to noise ratio of the input signal at which to switch between Modes will in general depend on the joint distribution of the noise in each input signal path, and also on N, M and the quantizer threshold levels in each quantizer.

Our description of methods for combining the responses of N quantizers is informed by consideration of a metric of how well, statistically, the combined quantization result will represent a randomly distributed input to the system. We use as a performance metric the signal to noise ratio of the output quantised signal. We first consider unprocessed summation and then consider weighted summation.

For the sake of mathematical performance analysis, each quantizer is assumed to receive as input the same sequences of samples drawn independently from a continuously valued random variable X with known probability density function $f_X(x)$, and variance $\sigma_X^2$ and support $S_X$. Each quantizer's input is assumed to be corrupted by additive random noise, such that each noise sample is drawn independently from a random variable, Z with probability density function $f_Z(z)$, zero mean, and finite variance, $\sigma_z^2$.

Quantizer performance is typically analysed using the signal to noise ratio of the output quantised signal. This is defined with respect to the mean square error between the input and the decoded output of the quantizer. In this context, decoding means a deterministic mapping from the states of V to reconstruction points, i.e. $\bar{x}=h(v)$. The reconstruction point $\bar{x}$ can be thought of as an estimate of x. Note that we assume that all reconstruction is done on a sample by sample basis, and that each input sample is assumed to be independent.

It is known that if the reconstruction points must be linearly spaced, then the optimal reconstruction points are given by the Wiener decoding. It can also be shown that the resulting signal to noise ratio of the output quantised signal can be expressed without actually calculating the optimal reconstruction points in terms of the linear correlation coefficient, $\rho_{xv}$, between outcomes of the random variables X and V. Specifically, in decibels the signal to noise ratio of the output quantised signal is $$SNR = -10 \log_{10}(1-\rho_{xv}^2) \quad (53)$$

Since the distribution of X is assumed to be known, calculation of the signal to noise ratio of the output quantised signal only requires calculation of the covariance between X and V and the variance of V. It can be shown that $$\rho_{xv} = \frac{E[xv] - E[x]E[v]}{\sqrt{\sigma_X^2(E[v^2] - E[v]^2)}} \quad (54)$$

If the reconstruction is permitted to be nonlinearly spaced, then in general the reconstruction points that maximise the signal to noise ratio of the output quantised signal are known to be given by $h(v)=E[X|V=v]:=\bar{x}^o$. In this case it can be shown that the signal to noise ratio of the output quantised signal can be expressed in terms of the correlation coefficient, $\rho_{x\bar{x}^o}$ between outcomes of X and decoded outcomes of V, i.e. $\bar{x}^o$. We write the signal to noise ratio of the output quantised signal for this optimal decoding as $$SNR_o = -10 \log_{10}(1-\rho_{x\bar{x}^o}^2) \quad (55)$$

Calculation of this quantity requires calculation of the covariance between x and $\bar{x}^o$ and the variance of $\bar{x}^o$. However, it is known that for the decoding $h(v)=E[X|V=v]$ that these two quantities are equal, and thus it suffices to only find the variance of $\bar{x}^o$. Unlike the linear decoding case however, it is necessary to calculate the actual reconstruction points in order to do this. It can be shown that $$\rho_{xx^o} = \sqrt{\frac{E[(\bar{x}^o)^2] - E[\bar{x}^o]^2}{\sigma_x^2}} \quad (56)$$

Each quantizer is assumed to operate on the same input signal with independent additive noise. We aim to bound the signal to noise ratio of the output quantised signal by considering the output signal to noise ratio that would result if the un-quantized noisy signals are combined by addition. Unfortunately, the optimal reconstruction points for nonlinear decoding cannot be derived in closed form for the case we consider (uniform signal and Gaussian noise).

However, a general result holds for optimal linear decoding in the specific case where u has the form u=Ax+z, x is independent of z, and E[z]=0. Under these assumptions, cov[xu]=A var[x] and var[u]=$A^2$ var[x]+var[z], and it can be shown that the signal to noise ratio of the output signal that results from linear decoding of the sum of the N unquantized noisy signals is given by $$SNR = 10\log_{10}\left(1 + \frac{N\text{var}[x]}{\sigma_z^2}\right). \quad (57)$$

If the responses of each quantizer are combined by summation, then as described above, the resulting single measurement can be expressed as the random variable V, and the outcomes of V as $$v=\Sigma_{j=1}^N \hat{y}_j, \; v \in \{0,1,\ldots,NM-1,NM\}. \quad (58)$$

In order to assess the signal to noise ratio of the output quantised signal, it is essential to 'decode' outcomes of V, by deterministically mapping each possible value of V to a 'reconstruction point', which we denote as $\bar{x}=h(v)$, where $h(\cdot)$ describes the mapping used.

In general, it is desirable in ADC applications that the mapping $h(\cdot)$ is linear, i.e. we can write $\bar{x}=sx+u$. Then, it is necessary to find suitable (and if practical, optimal) values of s and u; these will depend on N, M and the signal and noise distributions, in general. However, as noted above, when the set of biases $\{b_j\}$ are used (without attenuation), then the 'overload' regions of the input are larger than $\Delta_v$. Consequently, if the input, X, is uniformly distributed, then in the absence of input noise, the marginal probabilities that V=0 and V=N will be larger than the probabilities of any other state of V. Consequently, we can expect some gain in the signal to noise ratio of the output quantised signal if the reconstruction points for output values 0 and NM are not linearly spaced with respect to the other reconstruction points. Indeed, it is known that in the absence of input noise that the optimal reconstruction point for arbitrarily spaced threshold levels is the centroid of the interval corresponding to output value v.

For a uniformly distributed input variable, X, and uniformly spaced threshold levels (or virtual threshold levels), the optimal reconstruction points are given by the midpoints of the intervals corresponding to the output value. Thus, for the case where we guarantee a uniformly spaced virtual quantizer by employing attenuation, then we can use this result to state that the optimal reconstruction for the absence of input noise is given by an entirely linear decoding of v. This can equivalently be expressed in the form of $\bar{x}=w^T(\hat{y}+d)$, where weights and offsets have been applied, such that the weight is identical for all quantizer outputs.

Also, for the case of uniformly distributed input, X, and the biases described above without attenuation, we can also calculate optimal reconstruction points in mathematically closed form; these are given by the midpoints of the intervals in the virtual quantizer, weighted by the marginal probabilities of each interval occurring. We can derive for the specific case of the biases stated above that the optimal reconstruction points in the absence of input noise are $$\bar{x}_i = \phi_i + 0.5\Delta, i=1,\ldots,NM-1 \quad (59)$$

$$\bar{X}_0 = 0.50\phi_1 \quad (60)$$

$$\bar{x}_{NM} = 1 - 0.5\phi_1. \quad (61)$$

Thus, although the reconstruction points are not uniformly spaced for all output levels, they are all the midpoints of the corresponding virtual quantizer's intervals.

Again for the absence of input noise, in all other circumstances (arbitrarily distributed inputs, and threshold level spacings), finding the optimal centroids can be achieved using an iterative algorithm. The optimal linear reconstruction points can be found numerically.

We also note that nonlinearly spaced reconstruction functions, $h(\cdot)$, will, in general, outperform linear reconstruction functions. The statistically optimal nonlinear reconstruction points for the signal to noise ratio of the output quantised signal are known to be given by $\bar{x}=h(v)=E[X|V=v]$. It may happen, for uniformly distributed X, that these are uniformly spaced points for most v, but the optimal spacing will vary with the input noise level.

We also consider linearly transforming the individual responses of each quantizer prior to combining into a single measurement. In particular, we consider the transform resulting from subtracting, as an offset, the j-th bias value from the response of the j-th quantizer. We write this as $$r_j = \hat{y}_j - b_j, j=1,\ldots,N. \quad (62)$$

If these are combined by summation (equivalent to weighting all quantised signals with weights equal to unity) we obtain $$r = \Sigma_{j=1}^N r_j = v - \Sigma_{j=1}^N b_j, \quad (63)$$

where v is as described in the unprocessed summation section. It is straightforward to show that for the set $\{b_j\}$ described above, that $\Sigma_{j=1}^N b_j = 0$, and hence r=v, and in this instance there is nothing to be gained by subtracting the biases prior to combining, when it is assumed that combining is via summation. This does not imply that an offset should not be employed subsequently in order to improve the signal to noise ratio of the output quantised signal.

We now assume a uniformly distributed input signal confined to the interval [0,1], and independent additive Gaussian input noise at each quantizer. We then use the set of biases $\{b_j\}$ defined above for all input signal to noise ratios and calculate the corresponding signal to noise ratio of the output quantised signal using the reconstruction points described in [00131]. The result is compared with the case of no biases.

We now consider the case where there are no biases, and combining by summation. The special case of M=1 when all quantizers are identical has been studied in the statistical physics literature. This situation is of interest to that field because the setup exhibits optimal performance in the presence of high levels of input noise, where the input signal to noise ratio is of the order of 0 dB, which is an effect referred to as suprathreshold stochastic resonance. The reason that nonzero input noise is optimal is that in the absence of input noise, all quantizers provide identical responses, and the system is entirely redundant; the output is either V=0 or V=N, and consequently is just a binary representation. However, in the presence of independent input noise, all N+1 output states occur. For small input noise, most of these states occur with low probability, and hence the overall signal to noise ratio of the output quantized signal is dominated by quantization noise resulting from most outputs being either 0 or N. But for sufficiently large input noise, the quantization component of the signal to noise ratio of the output quantised signal is decreased as more output states are utilised to represent the input. Below some optimal input signal to noise ratio, the input noise begins to dominate quantization noise and performance degrades again.

Figure 9:
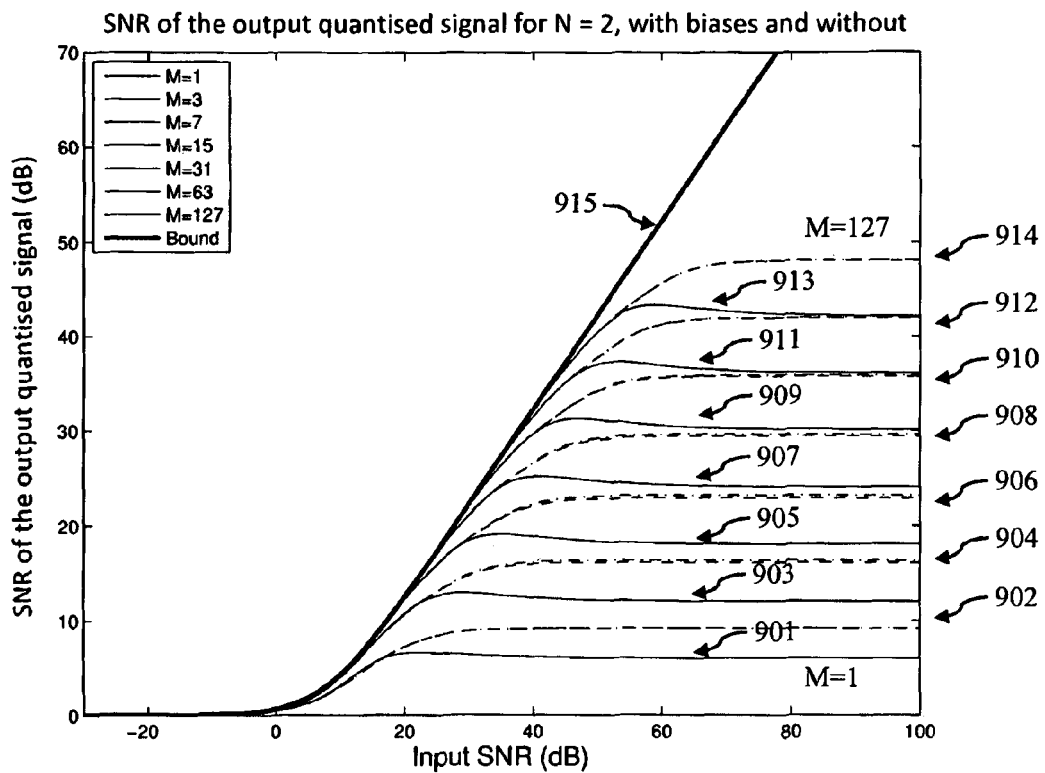
FIG. 9 is a plot of the signal to noise ratio of the output quantised signal vs input signal to noise ratio for N=2 parallel quantisers ranging from 1, 2, . . . , 7 bits, with and without biases that adjust each signal path, that are combined by summation according to an embodiment.

FIG. 9 plots the gain of signal to noise ratio of the output quantised signal vs input signal to noise ratio for N=2 identical quantisers, ranging from 1 to 7 bits. For the no bias case, solid lines are used for linear decoding for M=1 . . . 127 (lines 901 903 905 907 909 911 913). Dotted lines are used for nonlinear decoding but these are substantially identical to the linear decoding case and are not distinguishable. For the case of suboptimal linear biases, dashed lines are used for linear decoding and dot-dash lines represent nonlinear decoding for M=1 . . . 127 (lines 902 904 906 908 910 912 and 914). In these cases the non linear decoding results are very similar to the linear decoding results. The bound 915 for unquantized responses with linear decoding is also shown.

Figure 10:
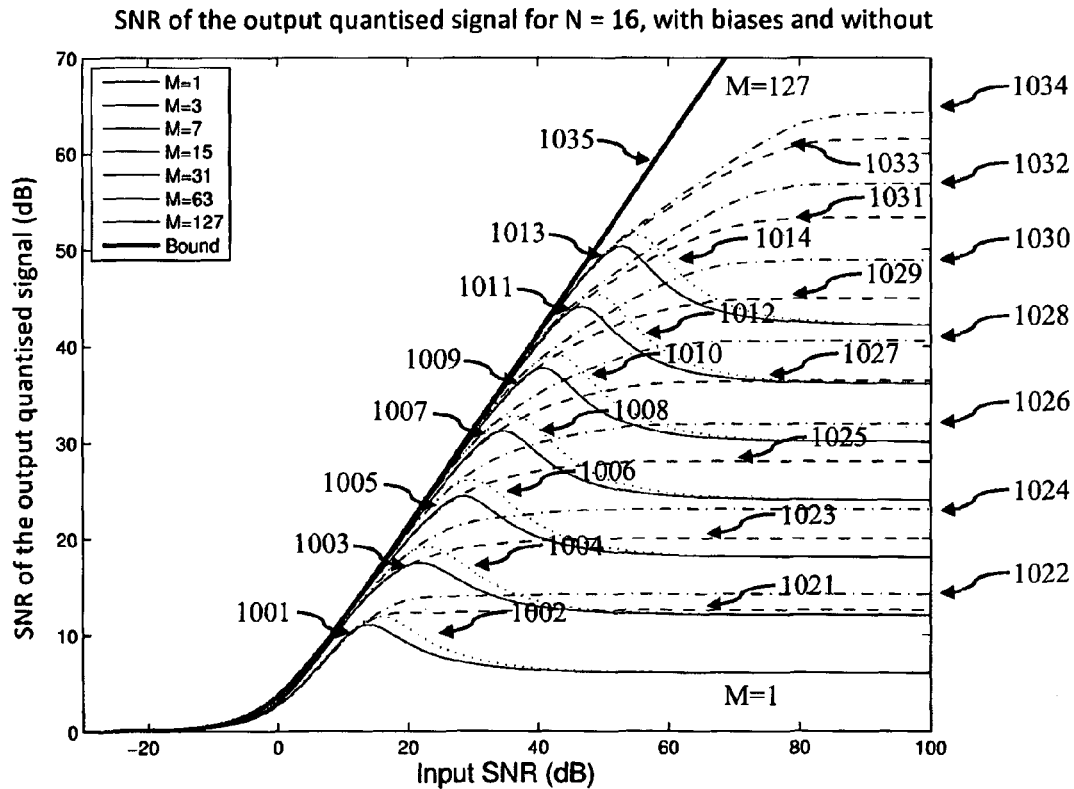
FIG. 10 is a plot of the signal to noise ratio of the output quantised signal vs input signal to noise ratio for N=16 parallel quantisers ranging from 1, 2, . . . , 7 bits, with and without biases that adjust each signal path, that are combined by summation according to an embodiment.

FIG. 10 is similar to FIG. 9, but in this case there are N=16 identical quantisers. For the no bias case, solid lines are used for linear decoding for M=1 . . . 127 (lines 1001 1003 1005 1007 1009 1011 1013). Dotted lines are used for nonlinear decoding for M=1 . . . 127 (lines 1002 1004 1006 1008 1010 1012 1014). For the case of suboptimal linear biases dashed lines are used for linear decoding for M=1 . . . 127 (lines 1021 1023 1025 1027 1029 1031 1033), and dot-dash lines represent nonlinear decoding for M=1 . . . 127 (lines 1022 1024 1026 1028 1020 1032 1034). The bound 915 for unquantized responses with linear decoding is also shown.

Here we find that qualitatively similar effects persist for the general case of M>1, when biases are not used. FIGS. 9 and 10 show for N=2 and N=16 respectively, that there exists an optimal input signal to noise ratio for M such that $\log_2(M+1)=\{1, 2, 3, 4, 5, 6, 7\}$ bits. For both N=2 and N=16, both the output signal to noise ratio of the output quantised signal corresponding to the optimal input signal to noise ratio, and the optimal input signal to noise ratio increase with increasing M.

Note also that FIGS. 9 and 10 show the signal to noise ratio of the output quantised signal for both linear and non-linear decoding. The same qualitative effects occur, but clearly non-linear decoding outperforms linear decoding, as expected. In both cases, the signal to noise ratio of the output quantised signal increases with increasing M, as should be expected, because increasing M decreases the noise due to quantization. However, the gain achieved by increasing M diminishes as the input signal to noise ratio decreases, in line with the well known rule of thumb for ADCs that the number of bits to use should decrease as the expected input signal to noise ratio decreases.

Figure 11:
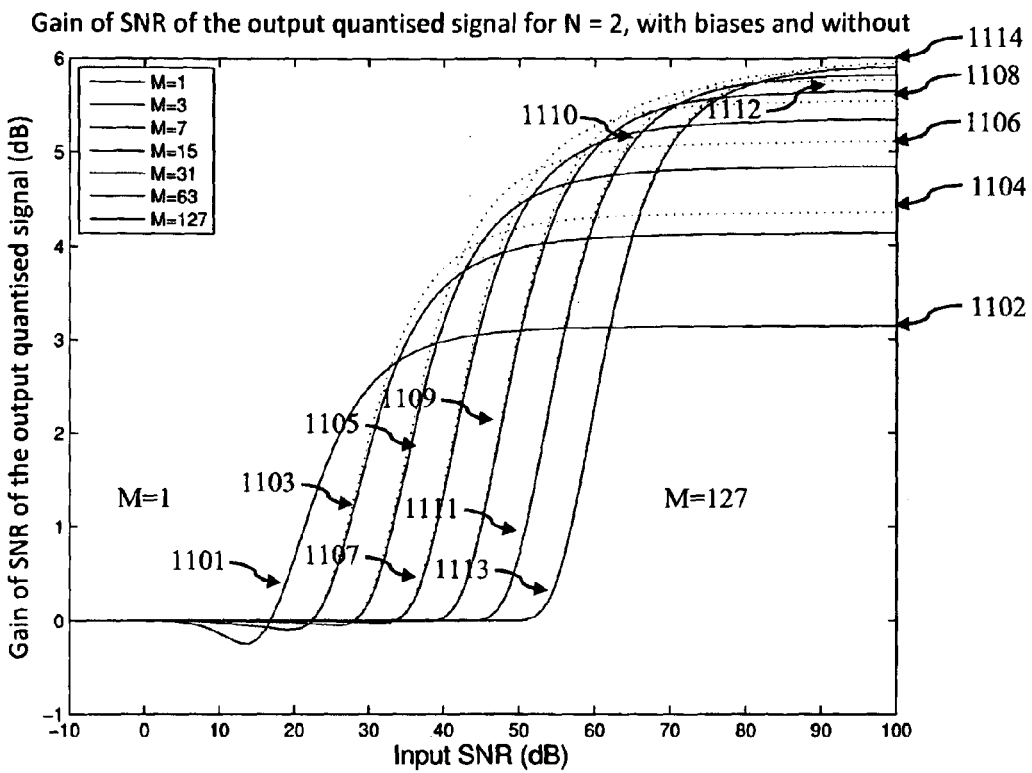
FIG. 11 is a plot of the gain in signal to noise ratio of the output quantised signal vs input signal to noise ratio for N=2 parallel quantisers with and without biases that adjust each signal path, according to an embodiment.
Figure 12:
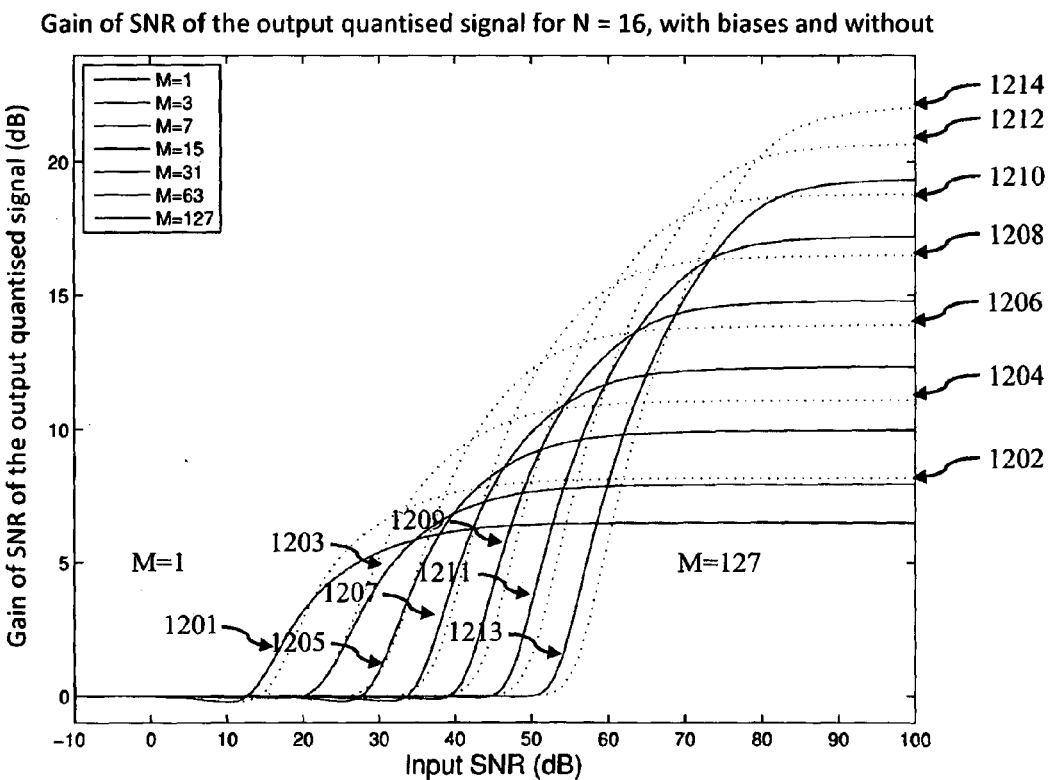
FIG. 12 is a plot of the gain in signal to noise ratio of the output quantised signal vs input signal to noise ratio for N=16 parallel quantisers with and without biases that adjust each signal path according to an embodiment.

We now consider the case of linear biases, combining by summation followed by decoding. FIGS. 9 and 10 also show that a gain can be achieved when the input noise is small by employing distinct biases in each quantizer. A small gain can also be achieved by using nonlinear decoding instead of linear decoding. This is not visible for N=2 in FIG. 9, but is clear for N=16 in FIG. 10. To clarify the various gains, FIGS. 11 and 12 show the gain in signal to noise ratio of the output quantised signal achieved when using biases versus not using biases. It is clear that for small input noise, the gain can approach 6 dB for N=2 and can be well over 20 dB for N=16 with nonlinear decoding.

FIG. 11 shows the gain of signal to noise ratio of the output quantised signal vs input signal to noise ratio when using biases versus not using biases, for N=2. Solid lines show linear decoding for M=1 . . . 127 (lines 1101 1103 1105 1107 1109 1111 1113). Dotted lines are used for nonlinear decoding for M=1 . . . 127 (lines 1102 1104 1106 1108 1110 1112 1114).

FIG. 12 shows the gain of signal to noise ratio of the output quantised signal vs input signal to noise ratio when using biases versus not using biases, for N=16. Solid lines show linear decoding for M=1 . . . 127 (lines 1201 1203 1205 1207 1209 1211 1213). Dotted lines are used for nonlinear decoding for M=1 . . . 127 (lines 1202 1204 1206 1208 1210 1212 1214). Where the nonlinear decoding gives a smaller gain than the linear decoding for some input signal to noise ratios, this does not imply that linear decoding is outperforming nonlinear decoding (mathematically, it cannot be); we emphasise that the comparisons are for linear decoding with biases to linear decoding without biases, and for nonlinear decoding with biases to nonlinear decoding without biases.

Where these gains are negative, it indicates that it is better to not use any biases at all, in comparison with using the biases given by $\{b_j\}$. This only occurs for input signal to noise ratios below some critical value, but it is also clear that as M increases, that this critical value of input signal to noise ratio becomes larger. Hence, we would expect that for larger M that the signal to noise ratio at which to switch between using biases versus not using biases, becomes larger.

We now consider how to find the optimal biases. It is of interest to determine the optimal set of $b_j$ as a function of the input noise variance, $\sigma_z^2$, the number of quantizers, N, and the number of quantization threshold levels in each quantizer, M. An optimisation problem equivalent to this question has previously been addressed for the special case of M=1, and it is known that the number of distinct bias values decreases in a series of bifurcations as the input noise level increases. That previous work is equivalent, but note that it was carried out in the context of optimizing the internal thresholds of binary quantizers, rather than on providing biases that virtually change the thresholds. In other words, this problem has not previously been cast as one in which N single-bit quantizers (M=1) with fixed and identical threshold levels receive inputs modified by the addition of biases. Nor has the problem been addressed for M>1. Finding optimal biases enables a design to be made for which the extent of the sub-optimality is known, and (as described above), informs a scheme for switching the use of biases on and off, depending on the input signal to noise ratio.

Figure 13:
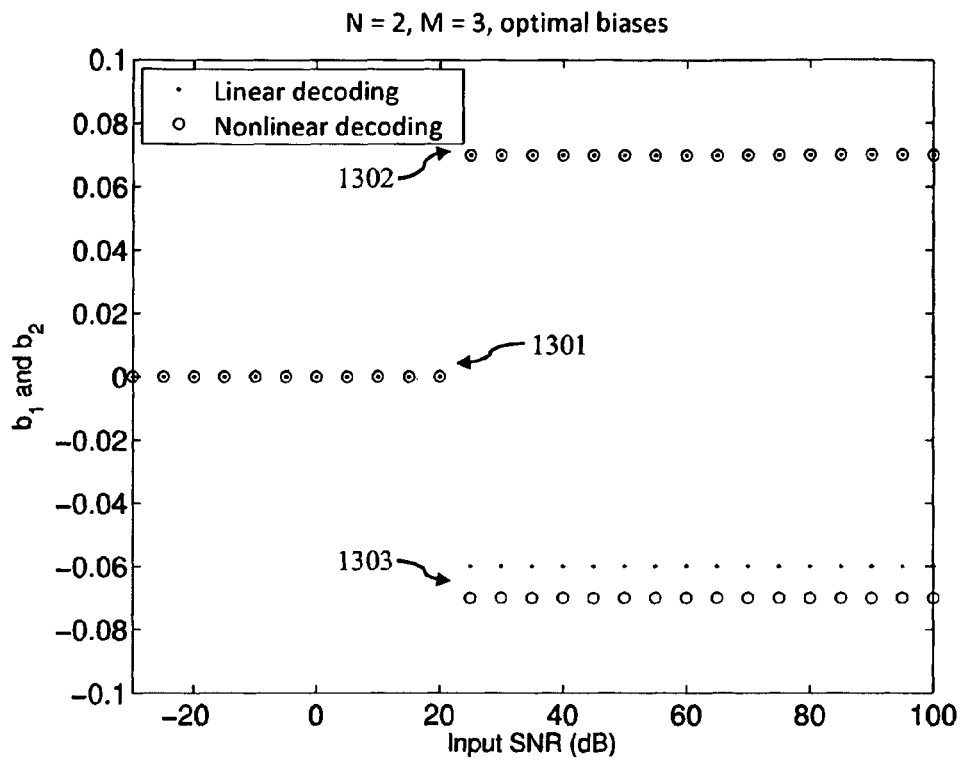
FIG. 13 is a plot of the optimal biases that adjust each signal path for N=2 and M=3, as input signal to noise ratio varies, according to an embodiment.
Figure 14:
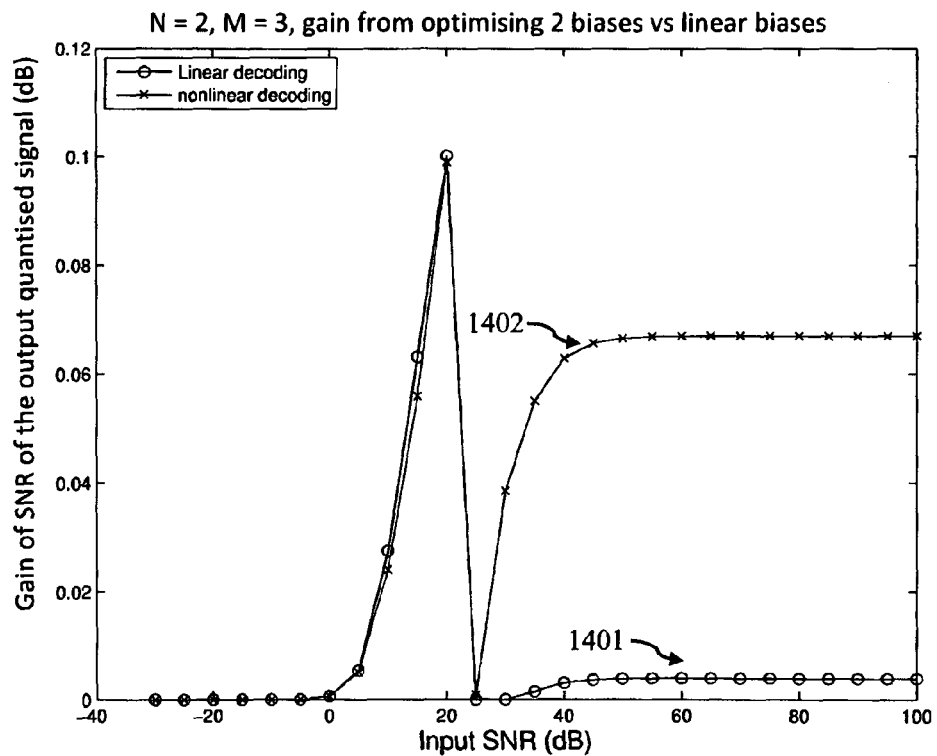
FIG. 14 is a plot of the gain in the signal to noise ratio of the output quantised signal when using optimal biases that adjust each signal path, for N=2 and M=3, in comparison with using no biases, as input signal to noise ratio varies, according to an embodiment.
Figure 15:
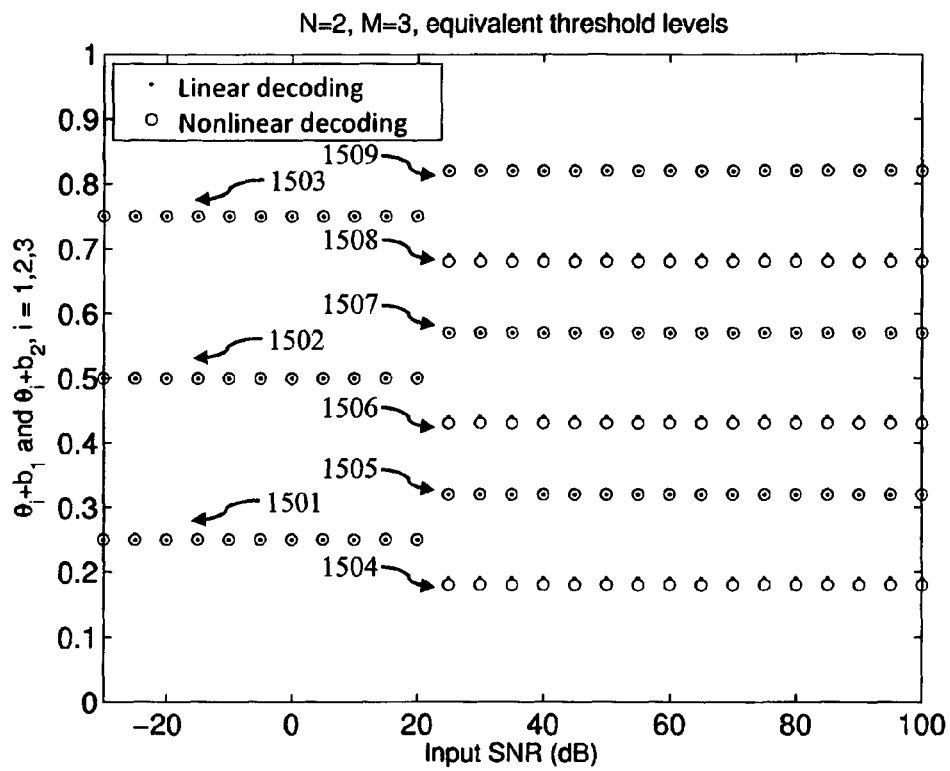
FIG. 15 is a plot of an optimal set of virtual quantizer thresholds for N=2 and M=3, as input signal to noise ratio varies according to an embodiment.

FIGS. 13 and 14 presents some results from numerical optimisation of the optimal biases for N=2 quantizers, with M=2 and M=3 threshold levels. FIG. 13 is a plot of optimal biases for N=2 and M=3, as input signal to noise ratio varies according. At low signal to noise ratio, optimal biases are zero 1301 and beyond a threshold (20 dB) non zero positive 1304 and negative optimal biases 1303 are shown. FIG. 14 is a plot of the gain in signal to noise ratio of the output quantised signal when using optimal biases for N=2 and M=3, in comparison with using no biases, as input signal to noise ratio varies for linear decoding 1401 and non linear decoding 1402. FIG. 15 is a plot of optimal virtual quantizer thresholds for N=2 and M=3, as input signal to noise ratio varies for linear decoding 1401 and non linear decoding 1402. At low input signal to noise ratio, optimal biases are zero 1501 1502 1503, and beyond a threshold (~20 dB) non zero positive 1505 1507 1509 and negative optimal biases 1504 1506 15098 are shown. The data shows that for sufficiently small input signal to noise ratio that it is optimal to not employ any biases at all, whereas for large input signal to noise ratio, the optimal solution changes negligibly in comparison with the optimal biases in the absence of input noise. These conclusions hold for both optimal linear and optimal nonlinear decoding.

Our example results verify that a gain in signal to noise ratio of the output quantised signal can be achieved by employing positive and negative linearly spaced biases at the input to multiple quantizers receiving a common input signal. This holds for independent input noise larger than some threshold value that depends on N, M and the signal and noise distributions. Our design ensures that the 'virtual quantizer' threshold levels are uniformly spaced between their smallest and largest values. Thus, the 'virtual quantizer' comprised from N quantizers, where each has $\log_2(M+1)$ bits, is almost identical to a $\log_2(NM+1)$ bit quantizer.

We conclude that incorporating biases as described results in a 'virtual quantizer' with approximately (when M is large) $\log_2(N)$ extra bits in comparison with a single quantizer. Given the quantizer rule of thumb of a signal to noise ratio of the output quantised signal gain of 6 dB per bit, we would expect a performance gain when combining quantizers of up to $6 \log_2(N)$ dB.

This theoretical conclusion is verified in FIGS. 11 and 12; the maximum gain for N=2 is near (but below) 6 dB and the maximum gain for N=16 is near (but below) 24 dB.

We now consider some ADC parallel structures in which the path adjustments incorporate both gains and bias. The following analysis is for an N branch parallel ADC architecture. The range of input levels that do not drive the ADCs into saturation is assumed to be ±A, where $$A = \left(2^{B_i} - 1 + \frac{1}{2}\right)\Delta$$

and $B_i$ is the number of ADC bits on the $i^{th}$ branch. Though the following discussion is based on identical ADCs, which means the number of bits $B_i$ equals a constant B across all N branches, those of skill in the art would be able to extend this structure to non-identical ADCs. The quantisation step $\Delta$ equals $2^{-B}$. The input signal is denoted as x. The output signal of the $i^{th}$ ADC is denoted as $\hat{y}_i$.

Figure 16:
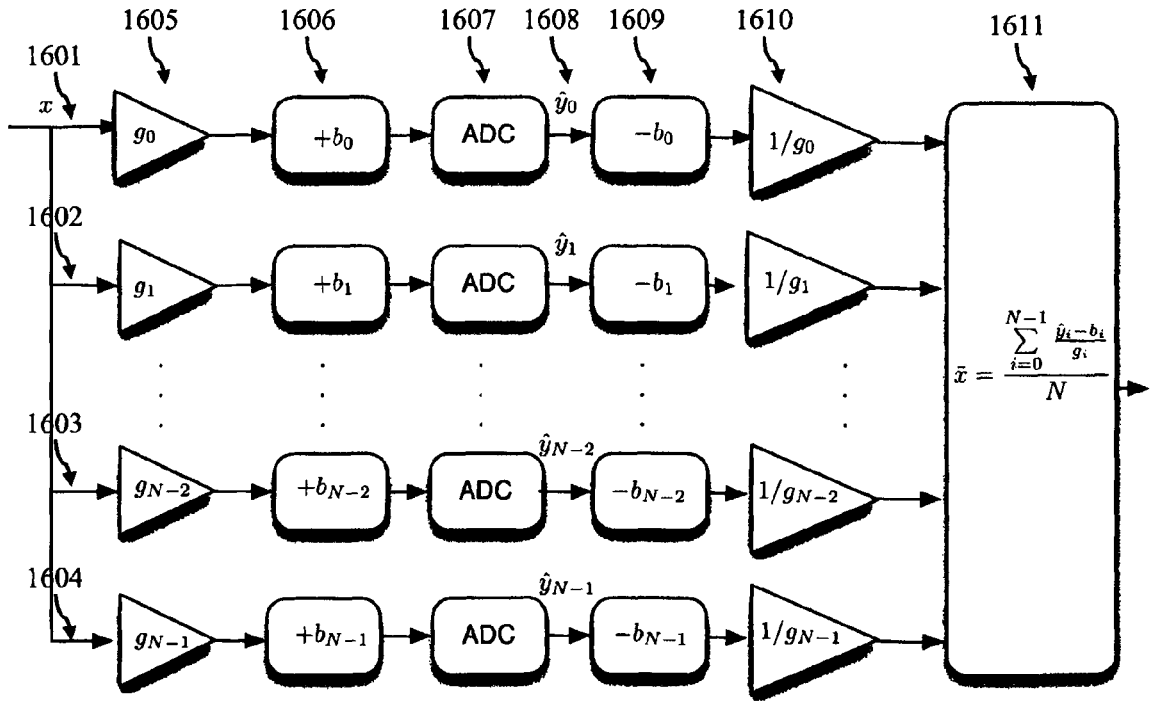
FIG. 16 is a schematic block diagram of a combined structure of Gain weighted and Biased ADC branches according to an embodiment.

Both the biased and gain weighted parallel ADC structures can improve the performance of a system with parallel ADCs. We will refer to the use of one or both of path gains and biases as path adjustments. FIG. 16 is a block diagram of a system in which the parallel paths have both gain weighted and biased ADC branches.

As shown in FIG. 3, the input signal on each branch first passes through an amplifier/attenuator with gain $g=[g_0, g_1, \ldots, g_{N-1}]^T$. For the branches for which $g_i=1$, the signal amplitude is not changed. After multiplication with the gain $g_i$, a bias $b_i$ is added to the signal before it passes through the ADC. If $b_i=0$, no bias is added to the input signal of the ADC. Then a combiner produces $\bar{x}$, the estimation of the input signal x, based on the outputs of the N ADCs. One simple example of such a combiner is first at the ADC output, the inverse operations may be performed to compensate for the bias and gain. Then an average of all N branches is computed to produce the final output of the combiner, which can be viewed as an estimate of the input signal x.

The gain multiplications and bias additions are linear operations and can be applied in different order to the signal on each branch. Thus we propose to apply a function $f_i(x)$ to the input signal of the $i^{th}$ ADC, where $f_i(x)$ is defined as $$f_i(x) = g_i x + b_i \quad (64)$$
$$= g_i(x + \tilde{b}_i)$$
where $\tilde{b}_i = \frac{b_i}{g_i}.$ Those of skill in the art of implementation can develop different structures to realise the function $f_i(x)$ which achieve the same effect on the signal as applying gains and biases. The choice of different implementations of this linear function could vary due to the values required and the components available. When using linear operations, the input signal of each ADC is a scaled and shifted version of the original input signal x, where the scaling factor (or gain) may be 1 and the shift (or bias) may be 0.

After quantisation and sampling by the ADC array, the output signals $\hat{y}_i$ are then passed to a combiner to form a reconstruction $\bar{x}$ of the input signal x. FIG. 16 illustrates one possible realisation of this reconstruction. In general, a linear function $L(\hat{y}_0, \hat{y}_1, \ldots, \hat{y}_{N-1})$ can be applied to the outputs of the ADC array to reconstruct x. Two possible realisations of $L(\hat{y}_0, \hat{y}_1, \ldots, \hat{y}_{N-1})$ are $$\bar{x} = \mathcal{L}(\hat{y}_0, \hat{y}_1, \ldots, \hat{y}_{N-1}) = \sum_{i=0}^{N-1}(w_i \hat{y}_i - w_i d_i) \quad (65)$$

or $$\bar{x} = \mathcal{L}(\hat{y}_0, \hat{y}_1, \ldots, \hat{y}_{N-1}) = \left(\sum_{i=0}^{N-1} w_i \hat{y}_i\right) - d',$$

where $d' = \sum_{i=0}^{N-1} w_i d_i$, where the $w_i$ are the combining weights of a combining method such as maximal ratio combining (MRC), gain weighted combining (GWC) or equal gain combining (EGC). Similar to the set of functions $f_i(x)$ before analog-to-digital conversion, different implementations of the function $L(\hat{y}_0, \hat{y}_1, \ldots, \hat{y}_{N-1})$ are possible to produce an estimate x of input signal $\bar{x}$ based on the outputs $\hat{y}$ of the ADC array, using weights $w_0, w_1, \ldots, w_{N-1}$ and offsets $d_0, d_1, \ldots, d_{N-1}$. Furthermore, the function L can include the hybrid combining method proposed above in the provisional patent to further optimise the estimate, which means $w_i$ can be a function of the output signal.

Figure 17:
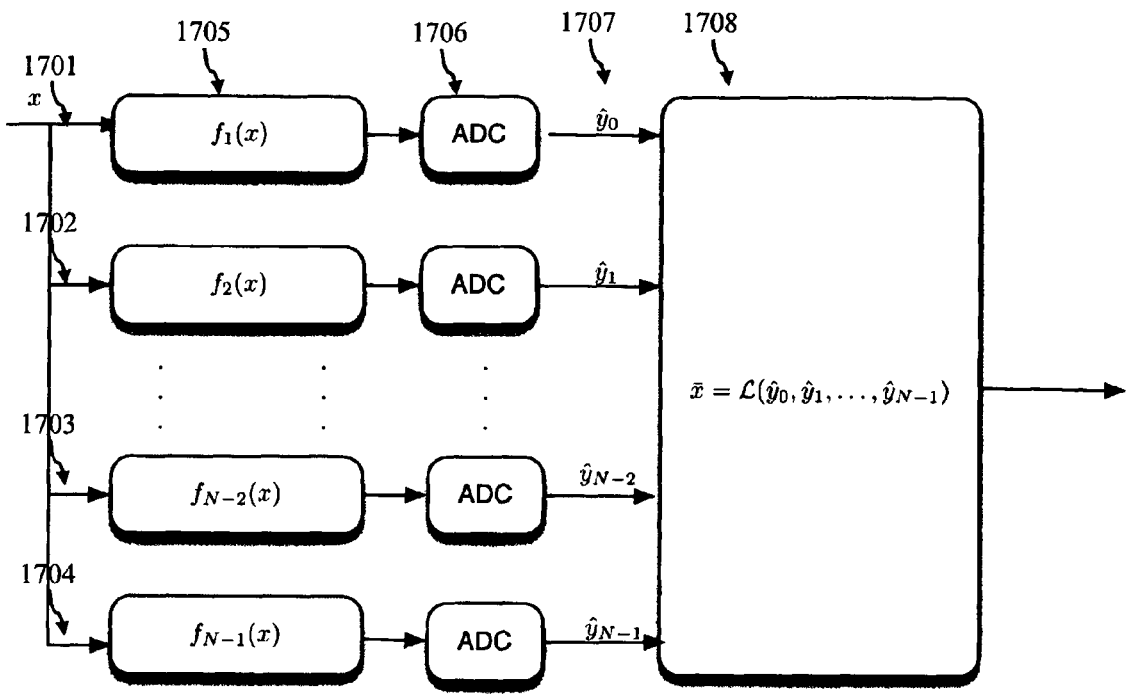
FIG. 17 is a schematic block diagram of a generalised parallel ADC architecture with branch gains and biases and ADC diversity combining according to an embodiment.

A generalised system architecture is shown in FIG. 17 and an example of the combining system using a three branch ADC architecture will now be discussed. Assume there are three identical 10 bit ADCs all with quantisation steps $\Delta=2^{-9}$. Consider two different architectures, which will be referred to as Architectures A and B. For Architecture A, we define $g_{a,0}=g_{a,1}=g_{a,2}=1$ and $b_{a,0}0$, $$b_{a,1} = \frac{1}{3}\Delta, b_{a,2} = \frac{-1}{3}\Delta,$$

which is equivalent to the biased system proposed above, whereas for Architecture B we select $g_{b,0}=g_{b,1}=1$, $g_{b,2}=2$ and $b_{b,0}=b_{b,2}=0$, $$b_{b,1} = \frac{1}{2}\Delta.$$

We also define two different combining functions $$\mathcal{L}_a(\hat{y}_{a,0}, \hat{y}_{a,1}, \hat{y}_{a,2}) = \frac{\hat{y}_{a,0} + \hat{y}_{a,1} + \hat{y}_{a,2} - b_{a,0} - b_{a,1} - b_{a,2}}{3} \quad (66)$$
$$= \frac{\hat{y}_{a,0} + \hat{y}_{a,1} + \hat{y}_{a,2}}{3},$$

$$\mathcal{L}_b(y_{b,0}, y_{b,1}, y_{b,2}) = \frac{\hat{y}_{b,0} + \hat{y}_{b,1} + \beta\hat{y}_{b,2} - b_{b,0} - b_{b,1} - \beta b_{b,2}}{2+\beta}$$
$$= \frac{\hat{y}_{b,0} + \hat{y}_{b,1} + \beta\hat{y}_{b,2} - \frac{1}{2}\Delta}{2+\beta},$$

where $$\beta = \begin{cases} 1/2 & |\hat{y}_{b,2}| \le 1 \\ 0 & |\hat{y}_{b,2}| > 1 \end{cases} \quad (67)$$

Architecture A is equivalent to distributing the $3\times(2^{B+1}-1)$ decision thresholds evenly across the interval [A, +A], which yields a quantisation step $$\Delta_a = \frac{1}{3}\Delta$$

across the whole range. Architecture A performs well for uniformly distributed input signals. Architecture B is equivalent to distributing $2\times(2^{B+1}-1)$ decision thresholds in $$\pm \frac{A}{2}$$

and $2^{B+1}-1$ decision thresholds in the range of $$|x| > \frac{A}{2},$$

uses a quantisation step $$\Delta_{b,1} = \frac{1}{4}\Delta$$

in the range of $$\pm \frac{A}{2} \text{ and } \Delta_{b,2} = \frac{1}{2}\Delta$$

outside the $$\pm \frac{A}{2}$$

range. The unevenly distribution of decision thresholds of Architecture B makes it perform better when the distribution of input signal is concentrated in the $$\pm \frac{A}{2}$$

range and input values $$|x| > \frac{A}{2}$$

are less likely to occur. For example an input signal has a normal distribution with mean zero and variance equal to 0.25. The details of the simulations are discussed below.

Simulations are performed for the 3-ADC Architectures A and B with setting defined above, as well as a single ADC. Two types of input signals are used: (i) a uniformly distributed signal in the range $[-1,1)$ and (ii) a Gaussian distributed signal with variance equal to $\sigma_x^2 = 0.25$. In both figures, the x-axis is the ratio of the standard deviation of noise $\sigma_n$ and the quantisation step $\Delta$ of a single ADC. The y-axis on both figures are represents the signal to noise ratio of the output quantised signal of.

Figure 18:
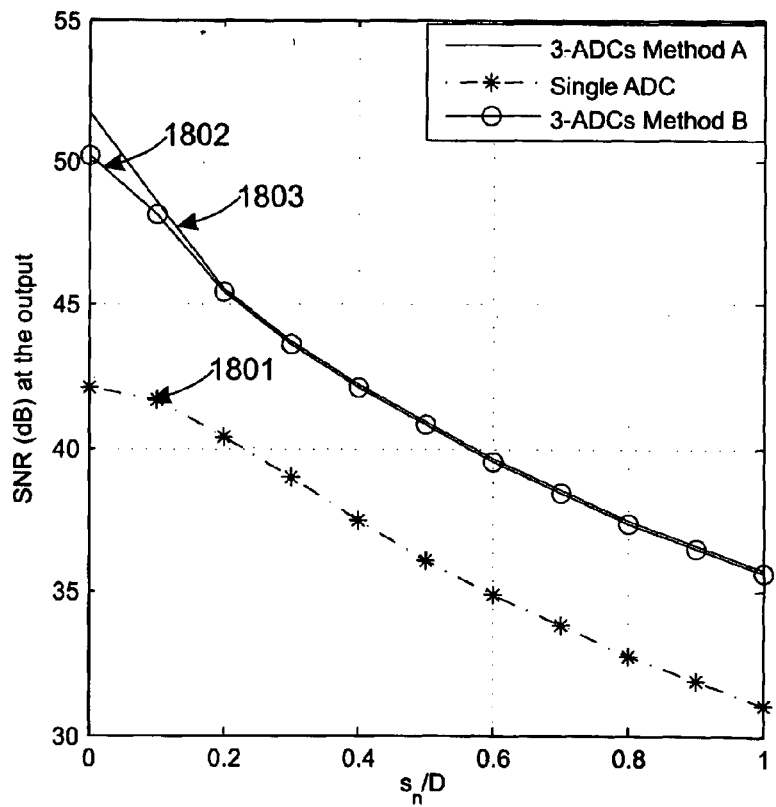
FIG. 18 is plot of the SNR performance of a three-ADC architecture, using a uniformly distributed input in the range of (−1, 1) according to an embodiment.

FIG. 18 shows the performance of Architecture A, Architecture B and a single ADC. We can see that Architectures A and B can both increase the SNR by about 9 dB to 4.75 dB compared to the single ADC solution. The performance achieved by Architecture B is less than 1 dB worse than that achieved by Architecture A in the case with no additional noise and almost equal in the presence of noise.

Figure 19:
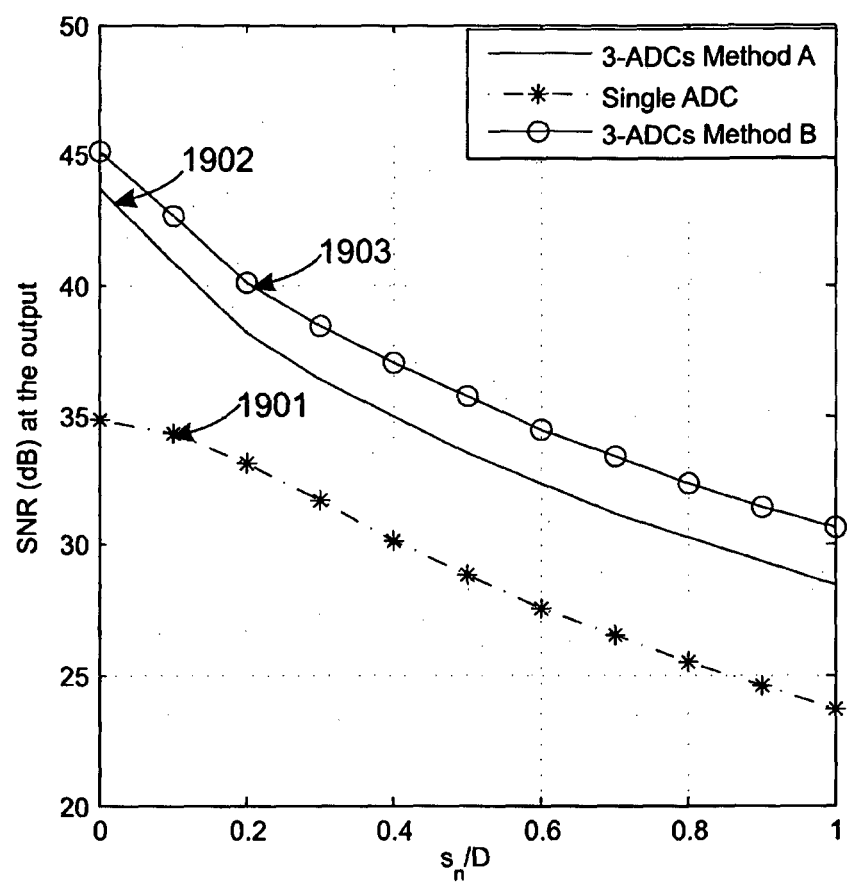
FIG. 19 is a plot of the SNR performance three-ADCs architecture, using a Gaussian distributed input with standard deviation $\sigma_x=0.25$ according to an embodiment.

FIG. 19 shows the performance of Architecture A, Architecture B and a single ADC, when the input signal is Gaussian distributed with zero mean and variance equal to 0.25. Compared to the single ADC solution, we can see that Architectures A increases the output SNR by about 5 dB to 8 dB, whereas architecture B increases the SNR by about 7 dB to 10 dB. In contrast to the results in FIG. 18, Architecture A is about 2 dB worse than Architecture B in most cases. The performance difference can be attributed to the optimal quantisation thresholds being different for different input signal distributions. Architecture A is equivalent to uniformly distributing the $3 \times 2^{10}$ decision thresholds in the range of $[-1,1)$. For the uniformly distributed input, Architecture A is the optimal way of arranging thresholds. In contrast, Architecture B has more decision thresholds in the range of $[-\frac{1}{2}, \frac{1}{2})$, and less thresholds outside this range. The quantisation steps for Architecture B are $\Delta/4$ for $x \in [-\frac{1}{2}, \frac{1}{2})$ and $\Delta/2$ for x outside this range. Therefore Architecture B is one implementation of non-uniform quantisation using identical ADCs, gain components and bias components. For a Gaussian distributed input signal, a non-uniform quantizer implemented as Architecture B can achieve better performance than a uniform quantiser.

Figure 7:
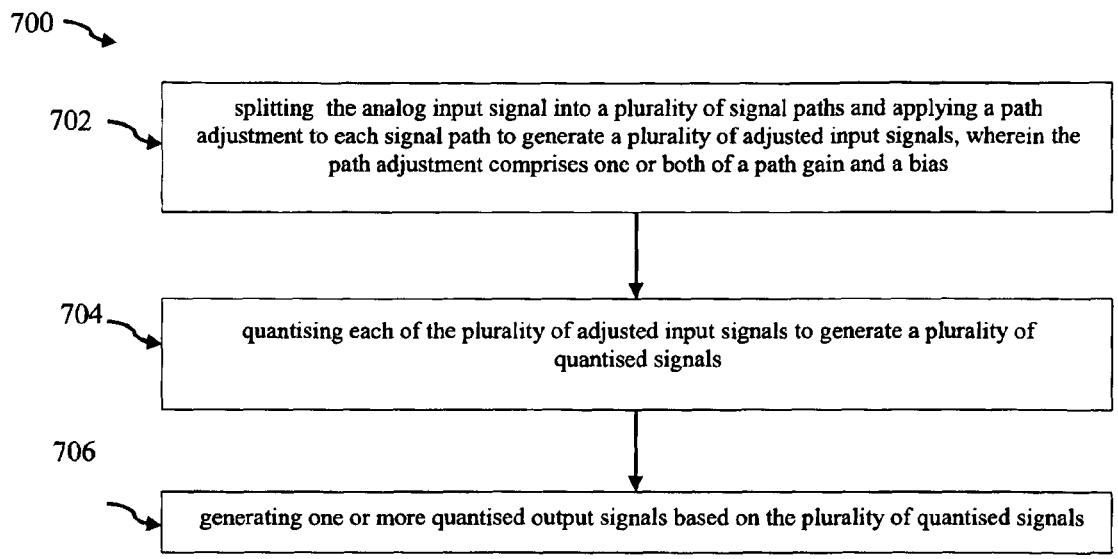
FIG. 7 is a flowchart of an embodiment of a method for generating one or more quantised output signals from an analog input signal.

The above description describes several embodiments of parallel ADC architectures that can be used to replace single ADC architectures. The parallel ADC architecture can comprise N branches and one ADC per branch. These ADCs can be all identical, all different or partly identical partly different. However each branch can have a different path adjustments applied to the ADC. That is each ADC receives a different combination of bias and/or gain, which could be different or the same in the non-identical ADC cases. Note that removing a gain stage from a path is equivalent to applying a unity gain for that path. Thus in effect a path with a bias is a path with a bias and unity gain adjustment. Though the above description is based on linear operation with fixed gain or bias on each branch, a person skilled in the art can apply non-linear operations such as gain and/or bias as a function of the input signal. FIG. 7 is a flowchart 700 of an embodiment of a method for generating one or more quantized output signal from an analog input signal. The method comprises the steps of:

splitting the analog input signal into a plurality of signal paths and applying a path adjustment to each signal path to generate a plurality of adjusted input signals, wherein the path adjustment comprises one or both of a path gain and a bias 702;

quantising each of the plurality of adjusted input signals to generate a plurality of quantised signals 704; and generating one or more quantised output signals based on the plurality of quantised signals 706.

Similarly a parallel analog to digital converter (ADC) apparatus for generating one or more quantised output signals from an analog input signal can be provided. This can be included in a digital front end processing apparatus, for example for use in a receiver in a wired or wireless communication system. The parallel ADC apparatus can comprise:

one or more signal splitters arranged to split an analog input signal into a plurality of signal paths, and one or more adjustment stages located in the plurality of signal paths to generate a plurality of adjusted input signals, wherein the adjustment stage is configured to apply one or both of a path gain and a bias;

a plurality of ADC stages for generating a plurality of quantised signals, wherein each ADC stage receives one of the plurality of adjusted input signals and quantises the adjusted input signal to generate a quantised signal; and a combiner for receiving the plurality of quantised signals and combining into one or more quantised output signals.

The combiner can also be used to apply various weighting schemes which apply a weight to each received quantised signal and combining the plurality of weighted quantised signals to generate the quantised output signal. This is an estimate of the input signal. By carefully choosing the path adjustments in each path, that is specific combinations of gains and biases applied to the input signal in a signal path, we can form different structures according to the input signal distribution to achieve better performance. For example, we can implement uniformly distributed decision thresholds or non-uniformly distributed decision thresholds using identical ADCs with different choices of gains and biases applied in the different paths. The ADCs on each branch can have uniform spacing or non-uniform spacing. The gains, bias, weights and offsets need to be optimized accordingly.

The generalized parallel ADC architecture and combiner methods improve the signal to noise ratio at the output signal o over single ADC frame works. For example the use of biases to create a parallel ADC architecture—a 'virtual quantizer' comprised from N quantizers, where each has $\log_2(M+1)$ bits, is almost identical to a $\log_2(NM+1)$ bit quantizer. When M is large this virtual quantizer effectively has $\log_2(N)$ extra bits in comparison with a single quantizer which provides an approximate performance gain of up to $6 \log_2(N)$ dB. Further using biases is a low complexity method and the decision on whether to apply biases can be based upon the input signal to noise ratio along with factors such as N and M. Other low complexity methods Gain Weighted Combining (GWC), Equal Gain Combining (EGC), Maximal Ratio Combining (MRC) are also able to increase the signal to noise ratio at the combiner output by reducing the effective quantisation noise in the combiner output. Hybrid Combining (HC) is able to increase the input range so that it is not clipped by saturation. Various embodiments in which (HC) is combined with the use of biases, GWC, EGC or MRC are able to simultaneously improve the signal to noise ratio and dynamic range by reducing the impact of quantisation noise, additive noise and saturation (or clipping). The properties of the input signal can be used to guide the choice of combination to use.

Any of a range of technologies may be used to implement the ADC arrangements, including commercial off the shelf ADCs, or commercial ADC integrated circuits. Integrated chips or modules comprising multiple gains and multiple ADCs may be provided. The gain stages may be passive or active attenuators, or amplifiers. The signal splitters, gain stages and/or ADC stages may be provided by discrete hardware elements or they may be combined into a several integrated chips or provided as a single integrated chip or module. The signal splitters can be any device or apparatus that is able to generate two or more copies of the input signal (or sufficiently similar copies of the original). The splitter and path adjustment stages could be combined in a single device/apparatus. For example an input signal to the device could be split into two (or more signals) and an adjustment applied to each split signal, so the output is two or more adjusted input signals.

Figure 8:
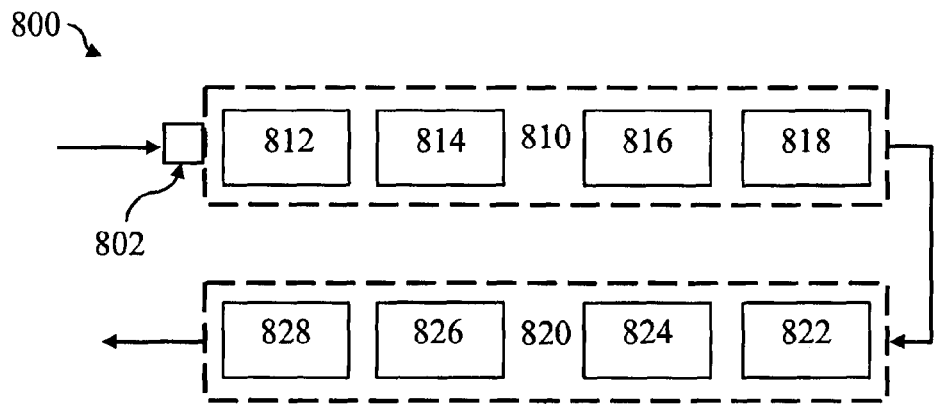
FIG. 8 is a block diagram of a receiver according to an embodiment.

A receiver and an associated communication system (further comprising a transmitter) which implement embodiments of the method described herein can also be provided. The communication system may be a wired or wireless communication system. FIG. 8 is a block diagram 800 of a receiver which implements the above described algorithm. The receiver comprises a receiver module 810, and a processing module 820. The receiver module comprises a signal receiving module 802 such as input port in a wired implementation, or an antenna in a wireless implementation. The receiver module 810 receives a transmitted signal, and prepares the signal for signal processing tasks performed by the digital processing module. In the case of a wireless receiver, the receiver module 810 (the RF front end in the case of RF wireless communications) comprises modules for performing tasks such as filtering and low noise amplification 812, frequency conversion 814, automatic gain control (AGC) 816 and quantisation of the received signal using an Analog to Digital Converter apparatus as described herein 818 to produce a digital signal. The digital processing module 820 receives the digital signal and performs a range of signal processing tasks to generate estimates of the transmitted bit stream. The digital processing can be implemented in application specific integrated circuits (ASICs), digital signal processors (DSPs), digital signal processing devices (DSPDs), programmable logic devices (PLDs), field programmable gate arrays (FPGAs), processors, controllers, etc and comprises modules for performing time offset (delay) estimation 822, carrier phase and amplitude estimation 824, demodulation 826, and symbol decoding 828. Further in one embodiment the method is stored as instructions in a non transitory processor readable medium (eg hard disk, Flash memory, optical disk (CDROM, DVD), etc) for causing a processor to implement the method.

The systems, methods, apparatus and architectures described above can be used to improve the performance of ADCs. The embodiments described herein can be used in a wide variety of both existing systems and applications such as audio/video processing, sensing, radar and communications, as well as emerging systems such as Software Defined Radio (SDR).

Those of skill in the art would understand that information and signals may be represented using any of a variety of technologies and techniques. For example, data, instructions, commands, information, signals, bits, symbols, and chips may be referenced throughout the above description and may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The steps of a method or algorithm described in connection with the embodiments disclosed herein may be embodied directly in hardware, in a software module executed by a processor, or in a combination of the two. For a hardware implementation, processing may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. A central processing unit (CPU) may be used, containing an Input/Output Interface, an Arithmetic and Logic Unit (ALU) and a Control Unit and Program Counter element which is in communication with input and output devices or modules through the Input/Output Interface, and a memory. Software modules, also known as computer programs, computer codes, or instructions, may contain a number of source code or object code segments or instructions, and may reside in any computer or processor readable medium such as a RAM memory, flash memory, ROM memory, EPROM memory, registers, hard disk, a removable disk, a CD-ROM, a DVD-ROM or any other form of computer readable medium. In the alternative, the computer readable medium may be integral to the processor. The processor and the computer readable medium may reside in an ASIC or related device. The software codes may be stored in a memory unit and executed by a processor. The memory unit may be implemented within the processor or external to the processor, in which case it can be communicatively coupled to the processor via various means as is known in the art.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

The reference to any prior art in this specification is not, and should not be taken as, an acknowledgement of any form of suggestion that such prior art forms part of the common general knowledge.

A detailed description of one or more preferred embodiments of the invention is provided above along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications, and equivalents. For the purpose of example, numerous specific details are set forth in the description above in order to provide a thorough understanding of the present invention. The present invention may be practised according to the claims without some or all of these specific details. For the purpose of clarity, technical material that is known in the technical fields related to the invention has not been described in detail so that the present invention is not unnecessarily obscured.

The invention claimed is:

1. A method for generating one or more quantised output signals from an analog input signal, the method comprising:
   splitting the analog input signal into a plurality of signal paths and applying a path adjustment to each signal path to generate a plurality of adjusted input signals, wherein the path adjustment comprises one or both of a path gain and a bias;
   quantising each of the plurality of adjusted input signals to generate a plurality of quantised signals; and
   generating one or more quantised output signals based on the plurality of quantised signals, wherein the step of generating one or more quantised output signals comprises applying a weight and/or offset to each quantised signal and a function of weighted and/or offset quantised signals generates the quantised output signal, and the path adjustments, weights and offsets are chosen to generate a diversity of weighted and/or offset quantised signals for generation of one or more quantised signals.

2. The method as claimed in claim 1, wherein the weight and/or offset applied to each quantised signal is proportional to or at least dependent on the path gain and/or bias applied to the respective signal path.

3. The method as claimed in claim 1, wherein a weight of zero is applied to the quantised signal if the magnitude of the respective adjusted input signal is greater than a magnitude threshold.

4. The method as claimed in claim 3, wherein if the magnitude of each of the plurality of adjusted input signals is greater than the respective magnitude threshold, then the quantised output signal is the quantised signal from the adjusted input signal that is subject to the least amount of clipping.

5. The method as claimed in claim 1, wherein a bias of zero is applied to the signal path if the signal to noise ratio of the respective adjusted input signal is smaller than an input signal to noise ratio threshold.

6. The method as claimed in claim 5, wherein the input signal to noise ratio threshold for the respective adjusted input signal is different from that for another adjusted input signal.

7. The method as claimed in claim 1, wherein the splitting step comprises splitting the analog input signal into N paths and each path has a path gain $g=[g_1\ g_2\ \ldots\ g_N]^T$ and/or bias $b=[b_1\ b_2\ \ldots\ b_N]^T$, and the output of each signal path is quantised to generate N quantised signals $\hat{y}=[\hat{y}_1\ \hat{y}_2\ \ldots\ \hat{y}_N]^T$, and one quantised output signal of the one or more quantised output signals is generated by applying N weights $w=[w_1\ w_2\ \ldots\ w_N]^T$ and/or offset $d=[d_1\ d_2\ \ldots\ d_N]^T$ to each of the N quantised signals to generate an output signal $\bar{x}=w^T(\hat{y}+d)$.

8. The method as claimed in claim 7, wherein the weights are chosen according to at least one of $$w = \frac{g}{g^T g} \text{ and } w = \frac{1}{1^T g}.$$

9. The method as claimed in claim 7, wherein $w \propto Q^{-1}g$, where Q is a noise covariance matrix.

10. The method as claimed in claim 7, wherein $g_i=(1/m_i)g_1$ for $i=2\ \ldots\ N$ where each $m_i$ is an even integer, $g_i=1/2^{i-1}$ for $i=1\ \ldots\ N$, and $g_i=(n_i/m_i)g_1$ for $i=2\ \ldots\ N$, where each pair $(n_i,m_i)$ with $n_i \le m_i$ is a pair of positive co-prime integers and one of the pair of positive co-prime integers is even and another one is odd.

11. The method as claimed in claim 10, wherein the ratios $n_i/m_i$ are close to unity and $n_i=2^{k_i}-1$ and $m_i=2^{k_i}$ for $i=2\ \ldots\ N$, where the $k_i$ are positive integers.

12. An apparatus for generating one or more quantised output signals from an analog input signal, the apparatus comprising:
   a splitter for splitting the analog input signal into a plurality of signal paths and applying a path adjustment to each signal path to generate a plurality of adjusted input signals, wherein the path adjustment comprises one or both of a path gain and a bias;
   a quantiser for quantising each of the plurality of adjusted input signals to generate a plurality of quantised signals; and
   a processor configured to generate one or more quantised output signals based on the plurality of quantised signals, wherein the processor is configured to apply a weight and/or offset to each quantised signal and a function of weighted and/or offset quantised signals to generate the quantised output signal, and the path adjustments, weights and offsets are chosen to generate a diversity of weighted and/or offset quantised signals for generation of the one or more quantised output signals.

13. The apparatus as claimed in claim 12, wherein a weight of zero is applied to a quantised signal if the magnitude of the respective adjusted input signal is greater than a magnitude threshold.

14. The apparatus as claimed in claim 13, wherein if the magnitude of each of the plurality of adjusted input signals is greater than the respective magnitude threshold, then the quantised output signal is the quantised signal from the adjusted input signal that is subject to the least amount of clipping.

15. The apparatus as claimed in claim 12, wherein a bias of zero is applied to the signal path if the signal to noise ratio of the respective adjusted input signal is smaller than an input signal to noise ratio threshold.

16. The apparatus as claimed in claim 15, wherein the input signal to noise ratio threshold for the respective adjusted input signal is different from that for another adjusted input signal.

17. The apparatus as claimed in claim 12, wherein the weight and/or offset applied to each quantised signal is proportional to or at least dependent on the path gain and/or bias applied to the respective signal path.

18. The apparatus as claimed in claim 12, wherein the splitter splits the analog input signal into N paths and each path has a path gain $g=[g_1\ g_2\ \ldots\ g_N]^T$ and/or bias $b=$ $[b_1 \ b_2 \ \ldots \ b_N]^T$, and the output of each signal path is quantised to generate N quantised signals $\hat{y}=[\hat{y}_1 \ \hat{y}_2 \ \ldots \ \hat{y}_N]^T$, and one quantised output signal of the one or more quantised output signals is generated by applying N weights $w=[w_1 \ w_2 \ \ldots \ w_N]^T$ and/or offset $d=[d_1 \ d_2 \ \ldots \ d_N]^T$ to each of the N quantised signals to generate an output signal $\bar{x}=w^T(\hat{y}+d)$.

19. A digital front end processing system comprising:
   an apparatus for generating one or more quantised output signals from an analog input signal, the apparatus comprising:
   a splitter for splitting the analog input signal into a plurality of signal paths and applying a path adjustment to each signal path to generate a plurality of adjusted input signals, wherein the path adjustment comprises one or both of a path gain and a bias;
   a quantiser for quantising each of the plurality of adjusted input signals to generate a plurality of quantised signals; and
   a processor configured to generate one or more quantised output signals based on the plurality of quantised signals wherein the processor is configured to apply a weight and/or offset to each quantised signal and a function of weighted and/or offset quantised signals to generate the quantised output signal, and the path adjustments, weights and offsets are chosen to generate a diversity of weighted and/or offset quantised signals for generation of one or more quantised output signals.

20. A receiver comprising:
   a digital front end processing system comprising:
   an apparatus for generating one or more quantised output signals from an analog input signal, the apparatus comprising:
   a splitter for splitting the analog input signal into a plurality of signal paths and applying a path adjustment to each signal path to generate a plurality of adjusted input signals, wherein the path adjustment comprises one or both of a path gain and a bias;
   a quantiser for quantising each of the plurality of adjusted input signals to generate a plurality of quantised signals; and
   a processor configured to generate one or more quantised output signals based on the plurality of quantised signals, wherein the processor is configured to apply a weight and/or offset to each quantised signal and a function of weighted and/or offset quantised signals to generate the quantised output signal, and the path adjustments, weights and offsets are chosen to generate a diversity of weighted and/or offset quantised signals for generation of one or more quantised output signals.

* * * * *